(12) United States Patent
Hayashi

(10) Patent No.: US 7,875,790 B2
(45) Date of Patent: Jan. 25, 2011

(54) METHOD OF PREPARING A THERMOELECTRIC MATERIAL, METHOD OF FORMING A THERMOELECTRIC DEVICE, AND METHOD OF FABRICATING A THERMOELECTRIC MODULE

(75) Inventor: Takahiro Hayashi, Hamamatsu (JP)

(73) Assignee: Yamaha Corporation, Shizuoka-ken (JP)

( * ) Notice: Subject to any disclaimer, the term of this patent is extended or adjusted under 35 U.S.C. 154(b) by 952 days.

(21) Appl. No.: 11/508,161

(22) Filed: Aug. 23, 2006

(65) Prior Publication Data
US 2007/0062571 A1 Mar. 22, 2007

(30) Foreign Application Priority Data
Aug. 25, 2005 (JP) .......................... P2005-245022

(51) Int. Cl.
*H01L 35/34* (2006.01)
(52) U.S. Cl. .................... 136/201; 438/54; 438/102; 117/11; 117/16; 117/209; 117/200
(58) Field of Classification Search ................ 136/201; 117/11, 16, 209, 200; 438/102
See application file for complete search history.

(56) References Cited
U.S. PATENT DOCUMENTS 5,885,345 A * 3/1999 Sakuragi ..................... 117/16

5,994,637 A * 11/1999 Imanishi et al. ............. 136/201

FOREIGN PATENT DOCUMENTS

| JP | 2003-347608 | 12/2003 |
| JP | 2004-63768 | 2/2004 |

OTHER PUBLICATIONS

Kim et al., Thermoelectric Properties of P-type 25% Bi2Te3 + 75%Sb2Te3 Alloys Manufactured by Rapid Solidification and Hot Pressing, Chungnam National University, Materials Science and Engineering, vol. 90, Issues 1-2, pp. 42-46, 2003.*

* cited by examiner

*Primary Examiner*—Jennifer K Michener
*Assistant Examiner*—Jayne Mershon
(74) *Attorney, Agent, or Firm*—Dickstein Shapiro LLP

(57) ABSTRACT

A method of preparing a thermoelectric material includes the following steps. A thermoelectric raw material can be filled into a cavity of a first mold so that the thermoelectric raw material filled in the cavity has first and second dimensions. The first dimension can be defined in a first direction. The second dimension can be defined in a second direction. The second direction can be perpendicular to the first direction. The first dimension can be equal to or greater than the second dimension. The thermoelectric raw material filled in the cavity can be cooled in a uniaxial direction that is parallel to the second direction at a cooling rate of at least 600° C./min.

39 Claims, 9 Drawing Sheets

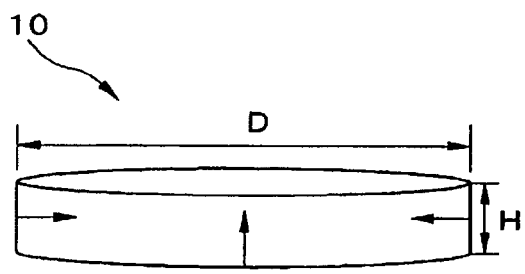
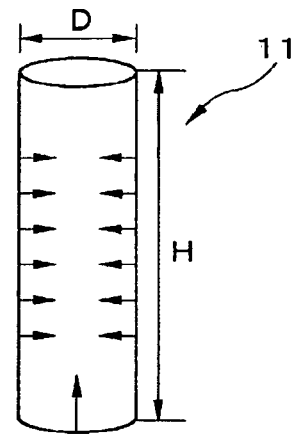
FIG. 2A  FIG. 2B
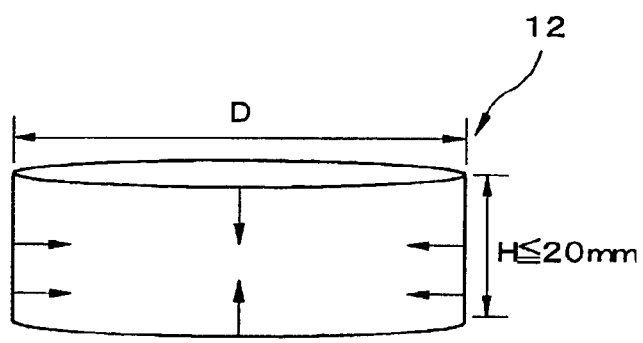
FIG. 3

METHOD OF PREPARING A THERMOELECTRIC MATERIAL, METHOD OF FORMING A THERMOELECTRIC DEVICE, AND METHOD OF FABRICATING A THERMOELECTRIC MODULE

BACKGROUND OF THE INVENTION

1. Field of the Invention

The present invention generally relates to a method of preparing a thermoelectric material, a method of forming a thermoelectric device, and a method of fabricating a thermoelectric module. More specifically, the present invention relates to a method of preparing a thermoelectric material by using a melting-solidification method, wherein the thermoelectric material is suitable for a thermoelectric device such as a Peltier device. Furthermore, the present invention relates to a method of forming a thermoelectric device that includes the thermoelectric material by using the melting-solidification method. Moreover, the present invention relates to a method of fabricating a thermoelectric module that includes the thermoelectric material by using the melting-solidification method.

Priority is claimed on Japanese Patent Application No. 2005-245022, filed Aug. 25, 2005, the content of which is incorporated herein by reference.

2. Description of the Related Art

All patents, patent applications, patent publications, scientific articles, and the like, which hereinafter be cited or identified in the present application, will hereby be incorporated by reference in their entirety in order to describe more fully the state of the art to which the present invention pertains.

A thermoelectric material can be used for a variety of thermoelectric devices such as the Peltier device. Typical examples of preparing the thermoelectric material may include, but are not limited to, a unidirectional solidification method, a hot-pressing method, and a deformation processing method.

In accordance with the unidirectional solidification method for preparing the thermoelectric material, a raw material is weighed. The weighed raw material is then melted to prepare a melt of raw material. This melt of raw material is then slowly cooled and solidified, while the melt of raw material has a thermal gradient. The solidified material has a unidirectionally oriented crystal structure. The solidified material is used as a thermoelectric material. The thermoelectric material prepared by the unidirectional solidification method is likely to have a high power factor (P.F.). The unidirectional solidification method is advantageous in low manufacturing cost. The power factor (P.F.) is an output factor that is expressed by Seebeck coefficient and resistivity. The power factor (P.F.) is given by the following equation.

(P.F.)=α²/ρ where α(V/K) is the Seebeck coefficient, and ρ(Ωm) is the resistivity.

In accordance with the hot-pressing method for preparing the thermoelectric material, a raw material is weighed. The weighed raw material is then melted to prepare a melt of raw material. This melt of raw material is then solidified to obtain an ingot of raw material. The ingot of raw material is then ground or milled to obtain powders of the raw material. The powders of the raw material are then filled into a cavity of a mold. Alternatively, the melt of raw material can be rapidly cooled to form powders or flakes of the raw material. The powders or flakes of the raw material can be then filled into the cavity of the mold. The powders or flakes of the raw materials are then pressed and sintered in the cavity of the mold to obtain a thermoelectric material that has a high strength. The thermoelectric material is suitable to be processed for a variety of thermoelectric device.

In accordance with the deformation processing method for preparing the thermoelectric material, a raw material is weighed. The weighed raw material is then melted to prepare a melt of raw material. This melt of raw material is then solidified to obtain an ingot of raw material. The ingot of raw material is then ground or milled to obtain powders of the raw material. Alternatively, the melt of raw material can be rapidly cooled to form powders or flakes of the raw materials. The powders or flakes of raw material are then hot-extruded. The hot-extruded raw material is then deformed by a forging method or an ECAP (Equal-Channel Angular Pressing) method, thereby obtaining a thermoelectric material that has a high strength. The thermoelectric material is suitable to be processed for a variety of thermoelectric device. Further, the thermoelectric material can exhibit high thermoelectric performance.

The thermoelectric material prepared by the above-described conventional method can be used to form a thermoelectric device. The thermoelectric device can further be used to fabricate a thermoelectric module. FIGS. 10A through 10E are perspective views illustrating sequential steps involved in a conventional method of fabricating a thermoelectric module.

The above-described conventional method is used to prepare an ingot of thermoelectric material 101, for example, a p-type thermoelectric material and an n-type thermoelectric material. FIG. 10A illustrates an ingot of thermoelectric material 101. The ingot of thermoelectric material 101 is sliced into plural wafers of thermoelectric material 102 by using a wire saw or an inside blade cutter.

With reference to FIG. 10B, plated layers 103 are formed on both surfaces of the thermoelectric material wafer 102. The plated layers 103 perform as barrier layers. The plated layers 103 can be made of a metal such as Ni.

With reference to FIG. 10C, the thermoelectric material wafer 102 with the plated layers 103 is diced into a plurality of thermoelectric devices 104 that are shown in FIG. 10D. For examples, a plurality of p-type thermoelectric devices is formed from the p-type thermoelectric material. Another plurality of n-type thermoelectric devices is formed from the n-type thermoelectric material. Each of the thermoelectric devices 104 has a cubic shape or a rectangular parallelepiped shape.

With reference to FIG. 10E, top and bottom substrates 106 and 105 are prepared, each of which has an array of electrodes. The plurality of thermoelectric devices 104 are mounted on the bottom substrate 105 so that the p-type and n-type thermoelectric devices are electrically connected in series to each other. The bottom substrate 105 has an array of the thermoelectric devices 104. The top substrate 106 is then bonded to the array of the thermoelectric devices 104 that is mounted on the bottom substrate 105, thereby fabricating a thermoelectric module. The bonding process can be carried out by using a soldering process in combination with a reflow apparatus or a hot plate.

Japanese Unexamined Patent Application, First Publication, No. 8-228027 discloses another conventional method of forming a thermoelectric device. A mold having a plurality of holes is dipped into a melt of thermoelectric material so that the plurality of holes is filled with the melt of thermoelectric material. The mold is cooled unidirectionally from one side thereof, so that the melt of thermoelectric material in each of the holes is unidirectionally solidified while the melt of thermoelectric material has a thermal gradient, for example, in the range of approximately 20° C./cm to approximately 40° C./cm. The unidirectional solidification forms a single crystal of thermoelectric material in each of the holes. The single crystal of thermoelectric material is defined by the shape of each of the holes. The single crystal of thermoelectric material has a bar shape. Namely, an ingot of single crystal thermoelectric material is formed in each of the holes. Each ingot of the single crystal of thermoelectric material is cut and divided into plural chips of crystal thermoelectric material at a predetermined length or size, thereby forming a plurality of thermoelectric devices.

Japanese Unexamined Patent Application, First Publication, No. 2003-347608 discloses another conventional method of forming a crystal of thermoelectric material for thermoelectric device. A mold release agent is applied on cavity walls of the mold. The mold release agent has a main component of carbon. The cavity of the mold has a cross-sectional area of at most 10 $mm^2$ and a length of at least 10 mm. A melt of thermoelectric material is flown into the cavity that is coated with the mold release agent. A crystallization of the melt of thermoelectric material is carried out at a rate of at most 2 mm/hour to form a crystal of thermoelectric material. The crystal of thermoelectric material is annealed at a temperature in the range of 80° C. to approximately 400° C. This conventional method improves the yield and reduces the manufacturing cost.

Japanese Unexamined Patent Application, First Publication, No. 2004-63768 discloses still another conventional method of preparing a thermoelectric material. A melt of thermoelectric material is crystallized to form a crystal ingot of thermoelectric material by using Bridgman method, Czochralski method, or zone-melt method. The crystal of thermoelectric material has crystal grain boundaries, on which an additive element is segregated and deposited. The crystal ingot of thermoelectric material is then exposed to a heat treatment in a vacuum or an inert gas so as to diffuse the additive element from the boundaries of crystal gains into the inside of crystal grains.

The above-described unidirectional solidification method can produce or prepare a thermoelectric material at a low cost, the thermoelectric material being likely to have a high performance. The prepared thermoelectric material has a cleavage. The cleavage makes it difficult to process the thermoelectric material to form a thermoelectric device. This issues can be solved by using a mold in solidifying the melt of thermoelectric material as disclosed in the above publications, for example, Japanese Unexamined Patent Applications, First Publications, No. 8-228027 and No. 2003-347608. In accordance with those conventional methods, the rod-shaped ingot of crystal thermoelectric material is cut or divided into chips of crystal thermoelectric material, thereby forming a plurality of thermoelectric devices. Plated layers are selectively formed on opposite surfaces of each of the thermoelectric devices. The selective formation of the plated layers is not easy.

The unidirectional solidification method further includes a cooling process that is carried out at a slow cooling rate. Cooling process at a slow cooling rate forms coarse crystal grains in the crystal thermoelectric material. The crystal thermoelectric material including coarse crystal grains is brittle. Thus, the thermoelectric device is also brittle. Whereas Japanese Unexamined Patent Application, First Publication, No. 8-228027 discloses that the melt of thermoelectric material in the mold can be rapidly cooled. The cooling direction is parallel to a longitudinal direction of the mold. Practically, however, it is not effective to carry out a unidirectional rapid cooling process in the cooling direction parallel to the longitudinal direction of the mold that contains the melt of thermoelectric material.

In accordance with the above-described conventional method disclosed in Japanese Unexamined Patent Application, First Publication, No. 2004-63768, the melt of thermoelectric material is crystallized to form a crystal ingot of thermoelectric material by using Bridgman method, Czochralski method, or zone-melt method. The crystal of thermoelectric material is then exposed to the heat treatment in the vacuum or the inert gas, while an additive element is segregated and deposited on the crystal grain boundaries of the crystal ingot of thermoelectric material. Segregation and deposition of the additive element make it difficult to obtain a uniform distribution of physical property of the thermoelectric material.

The thermoelectric material prepared by the hot-pressing method has a high strength and is suitable to be processed for a variety of thermoelectric device. The thermoelectric material is engaged with disadvantages in low thermoelectric performance and high manufacturing cost.

The thermoelectric material prepared by the deformation processing method has a high strength and is suitable to be processed for a variety of thermoelectric device. The thermoelectric material is likely to exhibit a high thermoelectric performance. The thermoelectric material is, however, disadvantageous in extremely high manufacturing cost.

In view of the above, it will be apparent to those skilled in the art from this disclosure that there exist needs for an improved method of preparing a thermoelectric material. This invention addresses this need in the art as well as other needs, which will become apparent to those skilled in the art from this disclosure.

SUMMARY OF THE INVENTION

Accordingly, it is a primary object of the present invention to provide a method of preparing a thermoelectric material.

It is another object of the present invention to provide a method of forming a thermoelectric device.

It is a further object of the present invention to provide a method of fabricating a thermoelectric module.

In accordance with a first aspect of the present invention, a method of preparing a thermoelectric material may comprise the following steps. A thermoelectric raw material can be filled into a cavity of a first mold so that the thermoelectric raw material filled in the cavity has first and second dimensions. The first dimension can be defined in a first direction. The second dimension can be defined in a second direction. The second direction can be generally perpendicular to the first direction. The first dimension can be equal to or greater than the second dimension. The thermoelectric raw material filled in the cavity can be cooled in a uniaxial direction that is generally parallel to the second direction at a cooling rate of at least 600° C./min. Preferably, the cooling rate can typically be equal to or less than 60,000° C./min.

Preferably, the thermoelectric raw material can comprise at least one of Bi and Sb and at least one of Te and Se.

Preferably, the cavity can have a three-dimensional shape that is defined by first and second finite planes and at least one side surface. The first and second finite planes extend vertical to the second direction. The first and second finite planes are distanced from each other in the second direction.

Preferably, the cavity can have a generally cylindrical shape that has a first center axis. The first center axis can be parallel to the second direction. The cavity can define the thermoelectric raw material into a generally cylindrical shape. The first dimension corresponds to a diameter of the generally cylindrical shape of the thermoelectric raw material. The second dimension corresponds to a height of the generally cylindrical shape of the thermoelectric raw material.

Preferably, the cavity can have a generally prismatic shape that has a second center axis. The second center axis can be parallel to the second direction. The cavity can define the thermoelectric raw material into a generally prismatic shape. The first dimension corresponds to a maximum diameter of an inscribed circle of the generally prismatic shape of the thermoelectric raw material. The second dimension corresponds to a height of the generally prismatic shape of the thermoelectric raw material.

Preferably, the uniaxial direction is a unidirection, and the second dimension is at most 10 millimeters. Preferably, the second dimension can be equal to or more than 0.1 millimeter.

Preferably, the uniaxial direction is bidirections that are anti-parallel to each other, and the second dimension is at most 20 millimeters. Preferably, the second dimension can be equal to or more than 0.1 millimeter.

Preferably, filling the thermoelectric raw material comprises filling a molten state of the thermoelectric raw material.

Preferably, filling the thermoelectric raw material comprises filling a solid state of the thermoelectric raw material. The method can further comprise: melting the solid state of the thermoelectric raw material filled in the cavity to prepare a molten state of the thermoelectric raw material before cooling the molten state of the thermoelectric raw material.

The method can further comprise: setting a second mold in the cavity of the first mold so as to thermally engage the second mold with the first mold, the second mold having at least one hole. Filling the thermoelectric raw material can comprise filling the thermoelectric raw material into the at least one hole.

Preferably, the second mold can be higher in thermal conductivity than the thermoelectric material.

In accordance with a second aspect of the present invention, a method of forming a thermoelectric device can comprise the following steps. A thermoelectric raw material can be filled into a cavity of a first mold so that the thermoelectric raw material filled in the cavity has first and second dimensions. The first dimension is defined in a first direction. The second dimension is defined in a second direction. The second direction is generally perpendicular to the first direction. The first dimension is equal to or greater than the second dimension.

The thermoelectric raw material filled in the cavity can be cooled at a cooling rate of at least 600° C./min. in a uniaxial direction that is generally parallel to the second direction, so as to prepare a solid state of thermoelectric material. Preferably, the cooling rate can typically be equal to or less than 60,000° C./min. A thermoelectric device is prepared from a solid state of thermoelectric material.

Preferably, the solid state of thermoelectric material can comprise an ingot of thermoelectric material. Preparing the thermoelectric device can comprise slicing the ingot of thermoelectric material into a wafer of thermoelectric material, forming at least one conductive layer on at least one surface of the wafer of thermoelectric material, and cutting the wafer of thermoelectric material with the at least one conductive layer into at least one chip.

Preferably, the thermoelectric raw material can comprise at least one of Bi and Sb and at least one of Te and Se.

Preferably, the cavity may have a three-dimensional shape that is defined by first and second finite planes and at least one side surface. The first and second finite planes can extend vertical to the second direction. The first and second finite planes can be distanced from each other in the second direction.

Preferably, the cavity can have a generally cylindrical shape that has a first center axis. The first center axis can be parallel to the second direction. The cavity can define the thermoelectric raw material into a generally cylindrical shape. The first dimension corresponds to a diameter of the generally cylindrical shape of the thermoelectric raw material. The second dimension corresponds to a height of the generally cylindrical shape of the thermoelectric raw material.

Preferably, the cavity has a generally prismatic shape that has a second center axis. The second center axis can be parallel to the second direction. The cavity can define the thermoelectric raw material into a generally prismatic shape. The first dimension corresponds to a maximum diameter of an inscribed circle of the generally prismatic shape of the thermoelectric raw material. The second dimension corresponds to a height of the generally prismatic shape of the thermoelectric raw material.

Preferably, the uniaxial direction is a unidirection, and the second dimension is at most 10 millimeters. Preferably, the second dimension can be equal to or more than 0.1 millimeter.

Preferably, the uniaxial direction is bidirections that are anti-parallel to each other, and the second dimension is at most 20 millimeters. Preferably, the second dimension can be equal to or more than 0.1 millimeter.

Preferably, filling the thermoelectric raw material comprises filling a molten state of the thermoelectric raw material.

Preferably, filling the thermoelectric raw material comprises filling a solid state of the thermoelectric raw material. In this case, the method may further comprise melting the solid state of the thermoelectric raw material filled in the cavity to prepare a molten state of the thermoelectric raw material before cooling the molten state of the thermoelectric raw material. More preferably, the method may further comprise setting a second mold in the cavity of the first mold so as to thermally engage the second mold with the first mold. The second mold can have at least one hole. Filling the thermoelectric raw material can comprise filling the thermoelectric raw material into the at least one hole. The solid state of thermoelectric material can comprise a chip of thermoelectric material in the at least one hole. Preparing the thermoelectric device can comprise forming at least one conductive layer on at least one exposed surface of the chip of thermoelectric material in the at least one hole so as to form a thermoelectric device in the at least one hole.

Preferably, the method may further comprise polishing, after cooling the thermoelectric material in the at least one hole, a protruding portion of the thermoelectric material. The protruding portion protrudes from the at least one hole.

Preferably, the second mold can be higher in thermal conductivity than the thermoelectric material.

In accordance with a third aspect of the present invention, a method of fabricating a thermoelectric module can comprise filling a thermoelectric raw material into a cavity of a first mold so that the thermoelectric raw material filled in the cavity has first and second dimensions. The first dimension can be defined in a first direction. The second dimension can be defined in a second direction. The second direction can be generally perpendicular to the first direction. The first dimension can be equal to or greater than the second dimension.

The thermoelectric raw material filled in the cavity can be cooled at a cooling rate of at least 600° C./min. in a uniaxial direction that is generally parallel to the second direction, so as to prepare a solid state of thermoelectric material. Preferably, the cooling rate can typically be equal to or less than 60,000° C./min. A plurality of thermoelectric devices can be prepared from a solid state of thermoelectric material. First and second substrates that have first and second arrays of electrodes, respectively, are prepared. The plurality of thermoelectric devices can be mounted on at least one of the first and second arrays of electrodes. The first and second substrates can be combined together so as to inter-connect the first and second arrays of electrodes to each other through the plurality of thermoelectric devices.

Preferably, the plurality of thermoelectric devices can comprise a first sub-plurality of first conductivity type thermoelectric devices and a second sub-plurality of second conductivity type thermoelectric devices. Mounting the plurality of thermoelectric devices can comprise: mounting the first sub-plurality of first conductivity type thermoelectric devices on the first array of electrodes of the first substrate; and mounting the second sub-plurality of first conductivity type thermoelectric devices on the second array of electrodes of the second substrate.

Preferably, combining the first and second substrates together can comprise combining the first and second substrates together so that a first pair of the first and second conductivity type thermoelectric devices is connected to a first one of the first array of electrodes, a second pair of the first and second conductivity type thermoelectric devices is connected to a second one of the first array of electrodes. The first and second ones can be positioned adjacent to each other. The first conductivity type thermoelectric device included in the first pair and the second conductivity type thermoelectric device included in the second pair can be positioned adjacent to each other and connected to a first one of the second array of electrodes.

Preferably, the thermoelectric raw material comprises at least one of Bi and Sb and at least one of Te and Se.

Preferably, the cavity can have a three-dimensional shape that is defined by first and second finite planes and at least one side surface. The first and second finite planes can extend vertical to the second direction. The first and second finite planes can be distanced from each other in the second direction.

Preferably, the cavity can have a generally cylindrical shape that has a first center axis. The first center axis can be parallel to the second direction. The cavity can define the thermoelectric raw material into a generally cylindrical shape. The first dimension corresponds to a diameter of the generally cylindrical shape of the thermoelectric raw material. The second dimension corresponds to a height of the generally cylindrical shape of the thermoelectric raw material.

Preferably, the cavity can have a generally prismatic shape that has a second center axis, the second center axis is parallel to the second direction, the cavity defines the thermoelectric raw material into a generally prismatic shape. The first dimension corresponds to a maximum diameter of an inscribed circle of the generally prismatic shape of the thermoelectric raw material. The second dimension corresponds to a height of the generally prismatic shape of the thermoelectric raw material.

Preferably, the uniaxial direction is a unidirection, and the second dimension is at most 10 millimeters. Preferably, the second dimension can be equal to or more than 0.1 millimeter.

Preferably, the uniaxial direction is bidirections that are anti-parallel to each other, and the second dimension is at most 20 millimeters. Preferably, the second dimension can be equal to or more than 0.1 millimeter.

Preferably, filling the thermoelectric raw material comprises filling a molten state of the thermoelectric raw material.

Preferably, the method can further comprise setting a second mold in the cavity of the first mold so as to thermally engage the second mold with the first mold. The second mold can have a plurality of holes. Filling the thermoelectric raw material can comprise filling the thermoelectric raw material into the plurality of holes of the second mold. The solid state of thermoelectric material can comprise chips of thermoelectric material in the plurality of holes of the second mold. Preparing the thermoelectric device can comprise forming at least one conductive layer on exposed surfaces of the chips of thermoelectric material in the plurality of holes so as to form a plurality of thermoelectric devices in the plurality of holes. Mounting the plurality of thermoelectric devices can comprise extruding the plurality of thermoelectric devices from the plurality of holes.

Preferably, the method can further comprise polishing, after cooling the thermoelectric material in the plurality of holes, protruding portions of the thermoelectric material in the plurality of holes, the protruding portion protruding from the plurality of holes.

Preferably, the second mold can be higher in thermal conductivity than the thermoelectric material.

These and other objects, features, aspects, and advantages of the present invention will become apparent to those skilled in the art from the following detailed descriptions taken in conjunction with the accompanying drawings, illustrating the embodiments of the present invention.

BRIEF DESCRIPTION OF THE DRAWINGS

Referring now to the attached drawings which form a part of this original disclosure:

FIG. 2A is a schematic perspective view illustrating a unidirectional cooling process for the melt of raw material filled in the cavity of the mold at an aspect ratio (D/H) that is equal to or greater than 1;

FIG. 2B is a schematic perspective view illustrating unidirectional cooling process for the melt of raw material filled in the cavity of the mold at another aspect ratio (D/H) that is smaller than 1;

FIG. 3 is a schematic perspective view illustrating a bidirectional cooling process for the melt of raw material filled in the cavity of the mold at an aspect ratio (D/H) that is equal to or greater than 1;

DETAILED DESCRIPTION OF THE INVENTION

Selected embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Figure 1A:
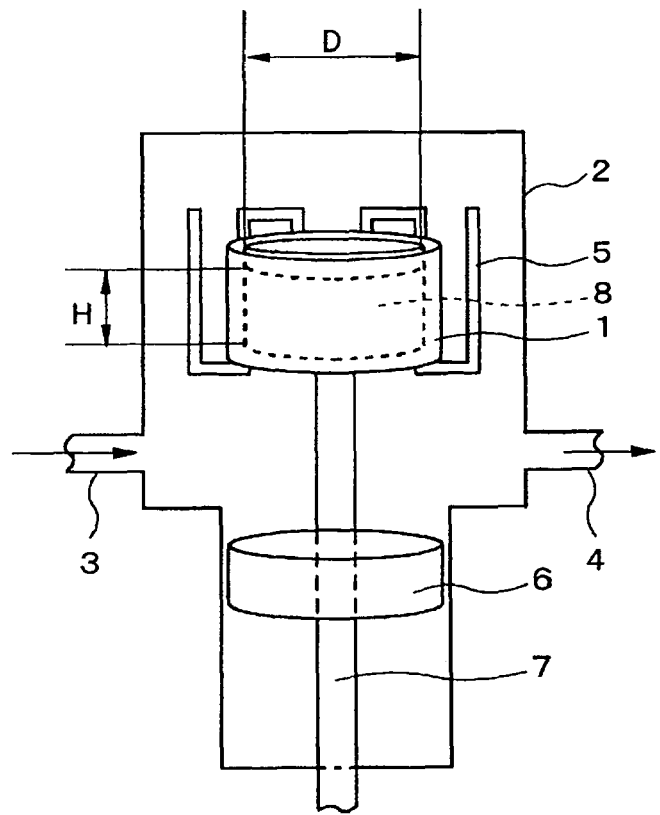
FIGS. 1A and 1B are schematic views illustrating sequential steps involved in a method of preparing a thermoelectric material in accordance with a first preferred embodiment of the present invention.
Figure 1B:
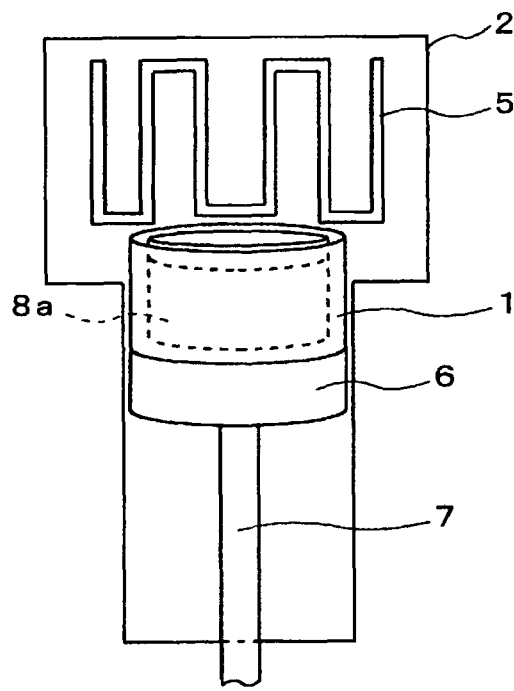

A first embodiment of the present invention will be described in detail. A method of preparing a thermoelectric material is provided. FIGS. 1A and 1B are schematic views illustrating sequential steps involved in a method of preparing a thermoelectric material in accordance with a first preferred embodiment of the present invention. A thermoelectric material is prepared which can have a composition comprising at least one of Bi and Sb and at least one of Te and Se. A raw material is weighed to prepare a weighed thermoelectric raw material 8 which has a predetermined composition. A mold 1 can have a cylindrically shaped cavity that has a predetermined diameter D and a predetermined cavity depth. The cavity depth corresponds to a height of the cavity. The cavity depth is a dimension of the cavity, which is defined in a direction parallel to a center axis of the cylindrical shape of the cavity. The thermoelectric raw material 8 is filled into the cavity of the mold 1 so that the thermoelectric raw material 8 has a height H that corresponds to a depth and a diameter D that correspond to the diameter D of the cavity. The height H of the thermoelectric raw material 8 satisfies a condition that an aspect ratio (D/H) of the diameter D to the height H is equal to or greater than 1. Namely, the condition $D/H \geq 1$ is satisfied. Needless to say, the height H is shallower than the predetermined cavity depth.

As shown in FIG. 1A, the mold 1 that contains the thermoelectric raw material 8 is loaded into a vacuum chamber 2. A heater 5 is provided in an upper region of the vacuum chamber 2. A water-cooling block 6 as a cooler is provided in a lower region of the vacuum chamber 2. Namely, the upper region of the vacuum chamber performs as a heater section, while the lower region thereof performs as a cooler section. The vacuum chamber 2 further has a gas introduction port 3 and a gas discharge port 4. The gas introduction port 3 allows a gas introduction into the vacuum chamber 2. The gas discharge port 4 allows a gas discharge from the vacuum chamber 2. An elevation rod 7 is further provided in the vacuum chamber 2. The elevation rod 7 is configured to elevate the mold 1 up and down in the vacuum chamber 2 so that the mold 1 moves between the heater section and the cooler section of the vacuum chamber.

The mold 1 is elevated up to the heater section by the elevation rod 7 so that the mold 1 is adjacent to the heater 5. The vacuum chamber 2 is vacuumed to a vacuum pressure of, for example, at most 0.133 Pa which is equivalent to 1E-3 Torr. An inert gas such as Ar gas or $N_2$ gas is introduced through the gas introduction port 3 into the vacuum chamber 2. The mold 1 is then heated up to a temperature of at least 700° C. by the heater 5 so as to melt the thermoelectric raw material 8 in the cavity of the mold 1, thereby forming a molten thermoelectric raw material 8a. The heating process can be carried out by a radio-frequency heating, or an ultrasonic heating. A physical stirring process can be carried out during the heating process. The radio-frequency heating and the ultrasonic heating alone or in combination with the physical stirring process is effective to homogenize the molten thermoelectric raw material 8a.

As shown in FIG. 1B, the mold 1 is then elevated down to the cooling section of the vacuum chamber 2 by the elevation rod 7 so that the mold 1 is thermally engaged with the water-cooling block 6. For example, a bottom of the mold 1 is in contact with or adjacent to the water-cooling block 6. The molten thermoelectric raw material 8a is rapidly and unidirectionally cooled by the water-cooling block 6 that is in contact with or adjacent to the bottom of the mold 1. The cooling direction is parallel to an upward direction from the bottom portion of the molten thermoelectric raw material 8a to the top portion thereof. Unidirectional rapid cooling process causes a rapid unidirectional solidification of the molten thermoelectric raw material 8a. For example, the unidirectional rapid cooling process can preferably be carried out at a cooling rate of at least 600° C./min. at any positions of the molten thermoelectric raw material 8a. The rapid cooling or the high cooling rate causes rapid solidification and crystallization of the molten thermoelectric raw material 8a. The rapid solidification and crystallization can form a crystal ingot of thermoelectric material that includes small crystal grains. The small crystal grains provide a high mechanical strength of the crystal ingot of thermoelectric material. Preferably, the cooling rate can typically be, but is not limited to, equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

In the above-described embodiment, the single water-cooling block 6 is provided under the mold 1 so that the molten thermoelectric raw material 8a is unidirectionally cooled in the upward direction from the bottom to the top thereof.

As a modification, the single water-cooling block 6 can be provided over the mold 1 so that the molten thermoelectric raw material 8a is unidirectionally cooled in the downward direction from the top to the bottom thereof.

As a further modification, a pair of top and bottom water-cooling blocks 6 can advantageously be provided over and under the mold 1. In this case, the top water-cooling block 6 is elevated down to contact with the top of the mold 1, while the bottom water-cooling block 6 is elevated up to contact with the bottom of the mold 1. The molten thermoelectric raw material 8a in the cavity of the mold 1 is rapidly and bidirectionally cooled. Namely, the molten thermoelectric raw material 8a is cooled in the upward direction from the bottom portion thereof and in the downward direction from the top portion thereof. This bidirectional rapid cooling process causes a bidirectional rapid solidification of the molten thermoelectric raw material 8a. For example, the bidirectional rapid cooling process can preferably be carried out at a cooling rate of at least 600° C./min. at any positions of the molten thermoelectric raw material 8a. The rapid cooling or the high cooling rate causes a rapid solidification and crystallization of the molten thermoelectric raw material 8a. The rapid solidification and crystallization can form a crystal ingot of thermoelectric material that includes small crystal grains. The small crystal grains provide a high mechanical strength. The crystal ingot of thermoelectric material may have, but is not limited to, a plate-shape.

Preferably, the cooling rate can typically be equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

After the solidification process is completed, the mold 1 that contains the crystal ingot of thermoelectric material is unloaded from the vacuum chamber 2. The crystal ingot of thermoelectric material is then released from the mold 1.

The thermoelectric material can be used to form a thermoelectric device or a thermoelectric module. In a case, the crystal ingot of thermoelectric material can be sliced into plural wafers of thermoelectric material by using a wire saw or an inside blade cutter. Plated layers are formed on both surfaces of each of the wafers of thermoelectric material. The plated layers perform as barrier layers. The plated layers can be made of a metal such as Ni.

The thermoelectric material wafer with the plated layers can be diced into plural chips of thermoelectric material. Each of the plural chips of thermoelectric material has a cubic shape or a rectangular parallelepiped shape. The chip of thermoelectric material can provide a thermoelectric device. The thermoelectric device can be classified into a p-type thermoelectric device and an n-type thermoelectric device. The p-type thermoelectric device can be made from a p-type thermoelectric material. The n-type thermoelectric device can be made from an n-type thermoelectric material.

First and second substrates are prepared, each of which has an array of electrodes. The plurality of thermoelectric devices is mounted on the first substrate so that the plated layers of the thermoelectric devices are made into contact with the electrodes of the first substrate. Namely, an array of the thermoelectric devices is thus formed over the first substrate. A reflow process or a hot-plate process can be used to carry out a soldering process for bonding the array of the thermoelectric devices to the second substrate. The p-type and n-type thermoelectric devices are alternately connected in series. The second substrate is bonded to the array of the thermoelectric devices that has already been mounted on the first substrate, thereby forming a thermoelectric module. The first substrate can be positioned under the array of thermoelectric devices, while the second substrate can be positioned over the array of thermoelectric devices.

In accordance with the method of preparing the thermoelectric material, the solidification of the molten thermoelectric raw material can be realized by carrying out a rapid cooling process at a cooling rate of at least 600° C./min. that is higher than that of the conventional cooling process. The rapid cooling process at the high cooling rate of at least 600° C./min. causes a rapid solidification and crystallization of the molten thermoelectric raw material. The rapid solidification and crystallization can thereby form a crystal of thermoelectric material that contains small crystal grains. The small crystal grains of the crystal of thermoelectric material provide a high mechanical strength. The high mechanical strength can provide a high machinability of the crystal of thermoelectric material. The crystal of thermoelectric material containing the small crystal grains can be machined by a known machining method. The rapid solidification and crystallization at the cooling rate of at least 600° C./min. can form the crystal of thermoelectric material that contains small crystal grains. The small crystal grains provide a high machinability of the crystal of thermoelectric material. Increasing the cooling rate reduces the crystal grain size average. Reducing the crystal grain size average increases the machinability of the crystal of thermoelectric material. Increasing the machinability of the crystal of thermoelectric material improves the yield of the thermoelectric device or the thermoelectric module. The cooling rate has no significant upper limit but can be limited by an actually available maximum cooling rate.

Preferably, the cooling rate can typically be, but is not limited to, equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

Meanwhile, as described above, at least one of the opposite surfaces of the mold 1, for example, at least one of top and bottom surfaces of the mold 1 can be thermally engaged with a cooler. Namely, at least one of the top and bottom surfaces of the mold 1 can be exposed to or is made into contact with the water cooling block so that the molten thermoelectric raw material is cooled in a uniaxial direction. The molten thermoelectric raw material can be uniaxially cooled in either a single cooling direction or two cooling directions that are antiparallel to each other. The uniaxial cooling process can cause a uniaxial solidification or crystallization of the molten thermoelectric raw material. The uniaxial solidification or crystallization can provide a uniaxial orientation to the crystal structure of the thermoelectric material. The uniaxial orientation to the crystal structure provides a high power factor to the crystal of thermoelectric material.

The uniaxial orientation of the crystal structure of thermoelectric material depends on not only the uniaxial cooling direction but also the above-described aspect ratio (D/H) of the diameter D to the height H of the molten thermoelectric raw material in the cavity of the mold 1. If the aspect ratio (D/H) is lower than 1, then it is difficult to provide the uniaxial orientation to the crystal structure of thermoelectric material. Carrying out uniaxial and rapid cooling process at the high cooling rate of at least 600° C./min. under the condition that the aspect ratio (D/H) is lower than 1 can form the crystal of thermoelectric material that has a high machinability and a high power factor.

Preferably, the cooling rate can typically be, but is not limited to, equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

FIG. 2A is a schematic perspective view illustrating a unidirectional cooling process for the melt of raw material filled in the cavity of mold at an aspect ratio (D/H) that is equal to or greater than 1. FIG. 2B is a schematic perspective view illustrating unidirectional cooling process for the molten raw material filled in the cavity of mold at another aspect ratio (D/H) that is smaller than 1.

As shown in FIG. 2A, a molten thermoelectric material 10 can be filled into the cavity of the mold 1 at an aspect ratio (D/H) that is equal to or greater than 1. The mold 1 is elevated down to the bottom water-cooling block 6 so that the bottom of the mold 1 is made into contact with the water-cooling block 6 to rapidly cool the molten thermoelectric raw material 10 filled in the cavity of the mold 1. In this case, the molten thermoelectric raw material 10 is rapidly cooled basically and primarily in a upward direction from the bottom portion of the molten thermoelectric material 10 toward the top portion thereof, and also rapidly cooled secondarily in horizontal directions from the side portion to the center portion. In other words, an entirety of rapid cooling process for rapidly cooling the molten thermoelectric material includes a primary cooling process and a secondary cooling process. The primary cooling process is uniaxially and upwardly directed from the bottom portion of the molten thermoelectric material 10 to the top thereof. The secondary cooling process is diametrically and inwardly directed from the peripheral side portion of the thermoelectric material to the center portion thereof. The primary cooling process dominates over the secondary cooling process, thereby providing the unidirectional orientation to the crystal structure of the solidified or crystallized thermoelectric material 10.

As shown in FIG. 2B, a molten thermoelectric raw material 11 can be filled into the cavity of the mold 1 at another aspect ratio (D/H) that is smaller than 1. The mold 1 is elevated down to the bottom water-cooling block 6 so that the bottom of the mold 1 is made into contact with the water-cooling block 6 to rapidly cool the molten thermoelectric raw material 11 filled in the cavity of the mold 1. In this case, the molten thermoelectric raw material 11 is rapidly cooled basically and primarily in horizontal directions from the peripheral side portion of the molten thermoelectric material 11 toward the center portion thereof, and also rapidly cooled secondarily in the vertical direction from the bottom portion of the thermoelectric material 11 toward the top portion thereof. In other words, an entirety of rapid cooling process for rapidly cooling the molten thermoelectric material includes a primary cooling process and a secondary cooling process. The primary cooling process is diametrically and inwardly directed from the peripheral side portion of the thermoelectric material to the center portion thereof. The secondary cooling process is uniaxially and upwardly directed from the bottom portion of the molten thermoelectric material to the top thereof. The primary cooling process dominates over the secondary cooling process, thereby providing no or almost no unidirectional orientation to the crystal structure of the solidified or crystallized thermoelectric material 11.

It is possible as a modification for the mold 1 to be elevated up to the top water-cooling block 6 so that the top of the mold 1 is made into contact with the top water-cooling block 6 to rapidly cool the molten thermoelectric material 10 filled in the cavity of the mold 1. In this case, the molten thermoelectric material 10 is rapidly cooled basically and primarily in a vertical direction from the top portion of the molten thermoelectric material 10 toward the bottom portion thereof, and also rapidly cooled secondarily in horizontal directions from the side portion to the center portion. In other words, the entirety of rapid cooling process for rapidly cooling the molten thermoelectric material includes a primary cooling process and a secondary cooling process. The primary cooling process is uniaxially and downwardly directed from the top portion of the molten thermoelectric material 10 to the bottom thereof. The secondary cooling process is diametrically and inwardly directed from the peripheral side portion of the thermoelectric material 10 to the center portion thereof. The primary cooling process dominates over the secondary cooling process, thereby providing the unidirectional orientation to the crystal structure of the solidified thermoelectric material 10.

If as shown in FIG. 2A, the mold 1 is unidirectionally cooled from the bottom or top to the top or bottom thereof, the height H of the thermoelectric material in the cavity of the mold 1 can preferably be equal to or lower than 10 mm. If the high H of the thermoelectric material in the cavity of the mold 1 exceeds 10 mm, then the thermoelectric material has a heat capacity that can be, in case, so high as to suppress or reduce the cooling rate, thereby providing no uniaxial orientation to the crystal structure of the thermoelectric material. In order to ensure to provide the uniaxial orientation to the crystal structure of the thermoelectric material, it is preferable for the thermoelectric material to be filled in the cavity of the mold 1 at the height H that is equal to or lower than 10 mm. Preferably, the height H can be equal to or more than 0.1 mm. If the height H is less than 0.1 mm, handling the thermoelectric material can be difficult.

FIG. 3 is a schematic perspective view illustrating a bidirectional cooling process for the melt of raw material filled in the cavity of mold at an aspect ratio (D/H) that is equal to or greater than 1. The mold 1 can be cooled uniaxially but bidirectionally from both the top and bottom thereof by making the top and bottom water-cooling blocks 6 into contact with the top and bottom of the mold 1. In this case, in order to ensure to provide the uniaxial orientation to the crystal structure of the thermoelectric material, it is preferable for the thermoelectric material to be filled in the cavity of the mold 1 at the height H that is equal to or lower than 20 mm. Preferably, the height H can be equal to or more than 0.1 mm. If the height H is less than 0.1 mm, handling the thermoelectric material can be difficult. This cooling process can preferably be carried out at the above-described cooling rate of at least 600° C./min. The cooling rate has no significant upper limit but can be limited by an actually available maximum cooling rate. Preferably, the cooling rate can typically be, but is not limited to, equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

It is possible as a further modification for the cavity of the mold 1 to have other shape than the above-described cylindrical shape. For example, the cavity of the mold 1 may have a polygonal column shape. In this case, an aspect ratio can be defined as a ratio of a maximum diameter D of one or more inscribed circles of the polygonal column to the height H of the thermoelectric material filled in the cavity. The thermoelectric material can preferably be filled in the polygonal column shaped cavity of the mold 1 so that the aspect ratio (D/H) is equal to or greater than 1.

A typical example of the mold 1 may include, but is not limited to, a top-opened pot that consists of bottom wall and a side wall.

After the thermoelectric material can be filled into the cavity of the mold 1, then the thermoelectric material can be melted in the cavity. In other case, the thermoelectric material can be melted outside the cavity of the mold 1 and then the melt of the thermoelectric material can be filled into the cavity of the mold 1 so that the aspect ratio (D/H) can be equal to or greater than 1.

As described above, the elevation rod 7 is fixed to the mold 1 so as to elevate the mold 1 up to the heating section of the vacuum chamber 2 for heating up the mold 1 and also elevate the mold 1 down to the cooling section for cooling down the mold 1.

Figure 4A:
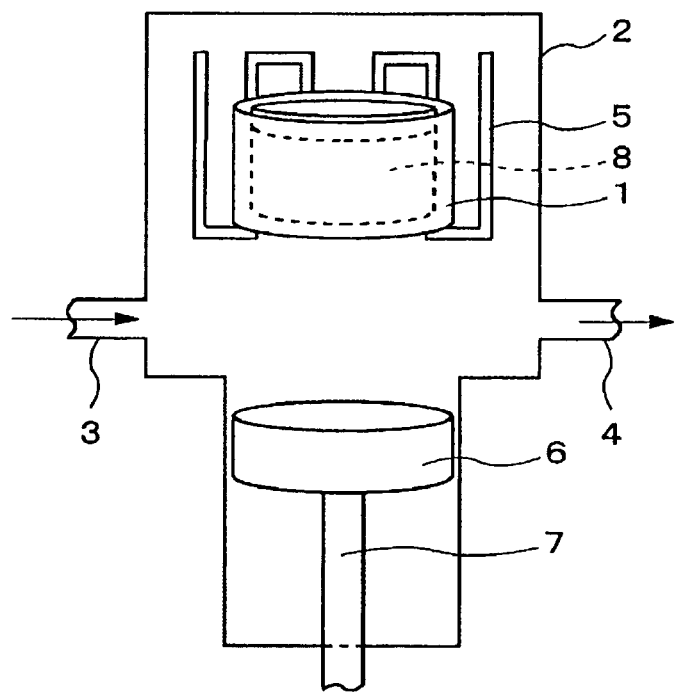
FIGS. 4A and 4B are schematic views illustrating sequential steps involved in another method of preparing a thermoelectric material in accordance with a first modification of the first preferred embodiment of the present invention.
Figure 4B:
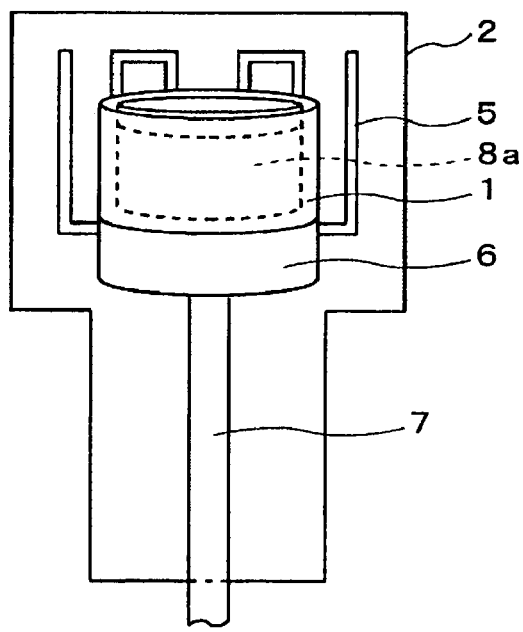

It is possible as a modification that the elevation rod 7 is fixed to the water-cooling block 6 to elevate the water-cooling block 6 up and down, while the mold 1 is fixed at a position near the heater 5. FIGS. 4A and 4B are schematic views illustrating sequential steps involved in another method of preparing a thermoelectric material in accordance with a first modification of the first preferred embodiment of the present invention.

As shown in FIG. 4A, the mold 1 is fixedly positioned in the upper section so that the mold 1 is positioned adjacent to the heater 5. The water-cooling block 6 is elevated down to the lower section by the elevation rod 7 so that the water-cooling block 6 is distanced from the mold 1. The mold 1 is thermally engaged with the heater 5 and thermally disengaged from the water-cooling block 6. The vacuum chamber 2 is vacuumed, and the inert gas is then introduced through the gas introduction port 3 into the vacuum chamber 2. The mold 1 is then heated up to a temperature of at least 700° C. by the heater 5 so as to melt the thermoelectric raw material 8 in the cavity of the mold 1 to form the molten thermoelectric raw material 8a.

As shown in FIG. 4B, the heater 5 is placed in not serves, while the water-cooling block 6 is elevated up to the upper section by the elevation rod 7 so that the water-cooling block 6 is made into contact with the bottom of the mold 1. The mold 1 is thermally engaged with the water-cooling block 6 and thermally disengaged from the heater 5. The molten thermoelectric raw material 8a is rapidly and unidirectionally cooled by the water-cooling block 6 that is in contact with or adjacent to the bottom the mold 1. The cooling direction is parallel to an upward direction from the bottom portion of the molten thermoelectric raw material 8a to the top portion thereof. Rapid and unidirectional cooling process causes a rapid unidirectional solidification of the molten thermoelectric raw material 8a. For example, the rapid and unidirectional cooling process is carried out at a cooling rate of at least 600° C./min. at any positions of the molten thermoelectric raw material 8a. The rapid cooling at the high cooling rate causes a rapid solidification and crystallization of the molten thermoelectric raw material 8a to form a crystal ingot of thermoelectric raw material that includes small crystal grains. The small crystal grains provide a high mechanical strength. The cooling rate has no significant upper limit but can be limited by an actually available maximum cooling rate. Preferably, the cooling rate can typically be, but is not limited to, equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

Figure 5A:
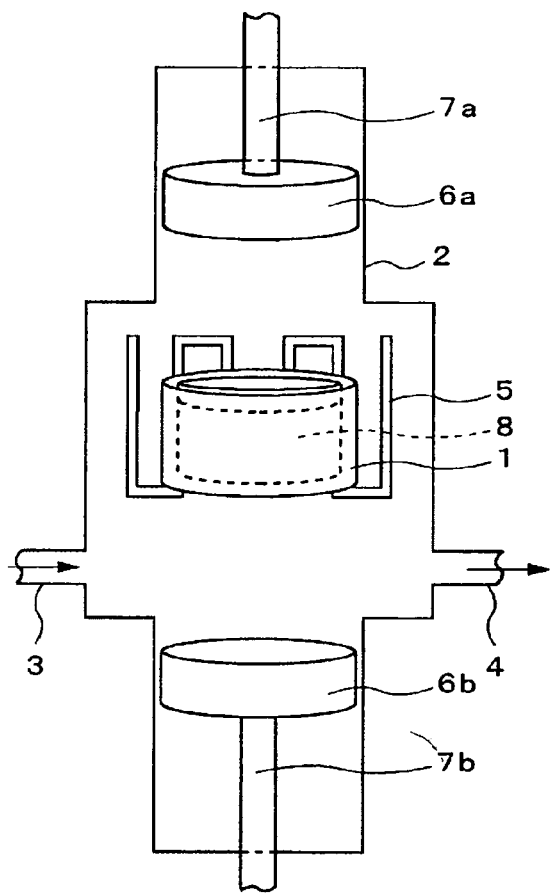
FIGS. 5A and 5B are schematic views illustrating sequential steps involved in still another method of preparing a thermoelectric material in accordance with a second modification of the first preferred embodiment of the present invention.
Figure 5B:
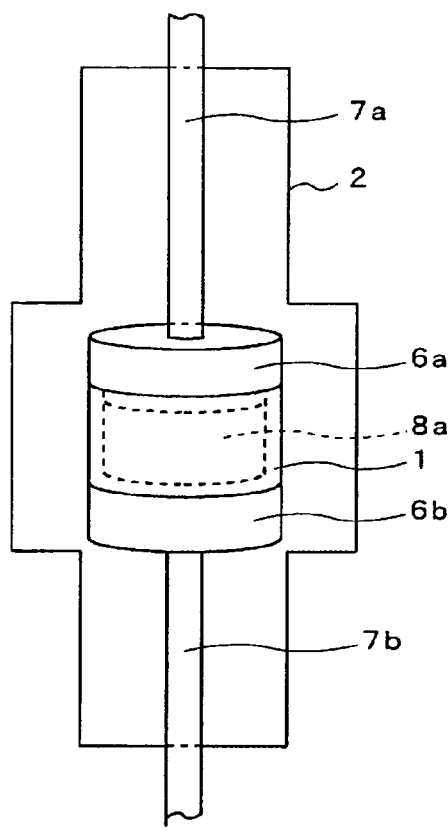

FIGS. 5A and 5B are schematic views illustrating sequential steps involved in still another method of preparing a thermoelectric material in accordance with a second modification of the first preferred embodiment of the present invention. It is possible as a further modification that top and bottom water-cooling blocks 6a and 6b are provided over and under the mold 1. Further, top and bottom elevation rods 7a and 7b are provided which are fixed to the top and bottom water-cooling blocks 6a and 6b, so as to elevate the top and bottom water-cooling blocks 6a and 6b up and down.

As shown in FIG. 5A, for carrying out the heating process, the top and bottom water-cooling blocks 6a and 6b are elevated up and down, respectively, so that the top and bottom water-cooling blocks 6a and 6b are distanced from the mold 1 whereby the mold 1 is thermally engaged with the heater 5 but thermally disengaged from the top and bottom water-cooling blocks 6a and 6b.

As shown in FIG. 5B, for carrying out the cooling process, the top and bottom water-cooling blocks 6a and 6b are elevated down and up, respectively, so that the top and bottom water-cooling blocks 6a and 6b are made into contact with the mold 1 whereby the mold 1 is thermally engaged with the top and bottom water-cooling blocks 6a and 6b but thermally disengaged from the heater 5.

Bidirectional rapid cooling process using the top and bottom water cooling blocks 6a and 6b allows increasing the cooling rate and shortening the cooling time period.

Figure 6:
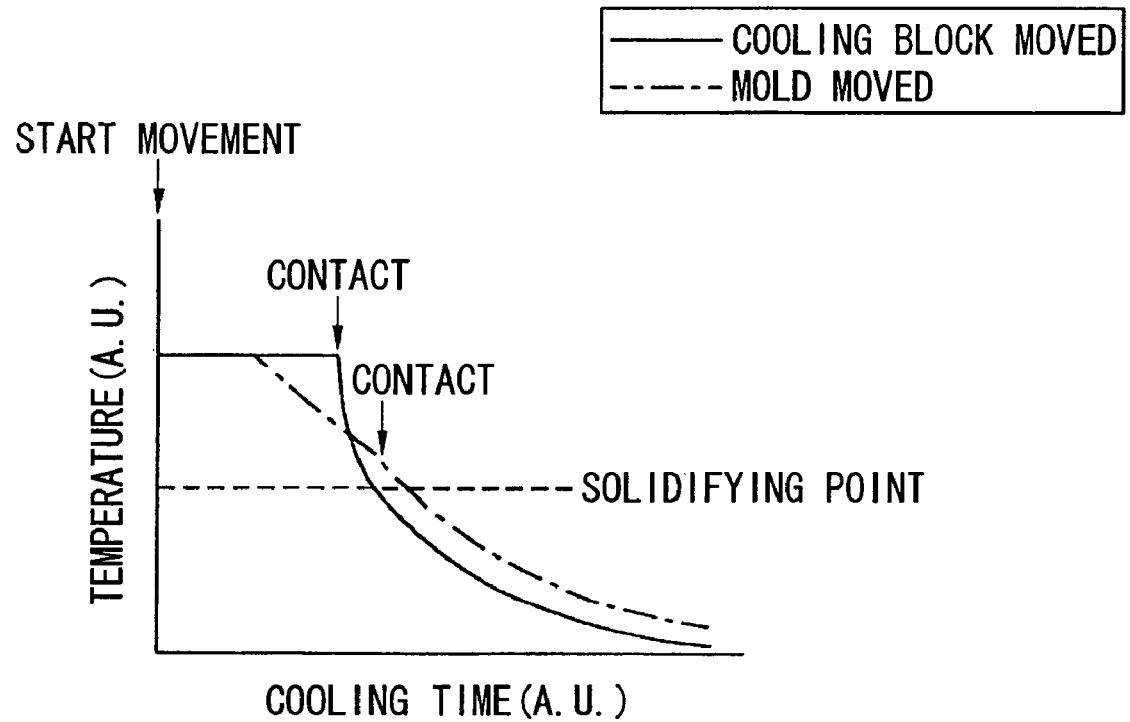
FIG. 6 is a graph illustrating variation in temperature of the mold 1 over cooling time.

FIG. 6 is a graph illustrating variation in temperature of the mold 1 over cooling time. A vertical axis of the graph represents the temperature of the mold, while a horizontal axis of the graph represents the cooling time. A horizontal broken line represents the level of a solidifying point. A long-dashed short-dashed line represents a variation in temperature of the mold 1 over cooling times when the mold 1 is elevated down to contact with the water-cooling block 6 as shown in FIGS. 1A and 1B. A real line represents another variation in temperature of the mold 1 over cooling times when the water-cooling block 6 is elevated down to contact with the mold 1 as shown in FIGS. 5A and 5B. A gradient of each of the real line and the long-dashed short-dashed line represents the cooling rate.

As shown in FIGS. 1A and 1B, after the heat process has been completed, then the mold 1 is moved from the heating section to the cooling section. The mold 1 is moved from the heating position adjacent to the heater 5 toward the cooling position adjacent to the water cooling block 6, while the mold 1 has a preliminary drop of temperature of the mold 1 before the mold 1 is made into contact with the water-cooling block 6 as represented by the long-dashed short-dashed line. Namely, the preliminary drop of temperature of the mold 1 appears during when the mold 1 is moved from the heating position to the cooling position. After the mold 1 is made into contact with the water-cooling block 6, the mold 1 is cooled at varying cooling rates as represented by the long-dashed short-dashed line.

As shown in FIGS. 5A and 5B, after the heat process has been completed, then the mold 1 is fixed adjacent to the heater 5, while the water-cooling blocks 6a and 6b are moved toward the mold 1 during when the mold 1 has no or almost no temperature drop. In other words, the mold 1 fixed adjacent to the heater 5 has no or almost no temperature drop until the water cooling blocks 6a and 6b are made into contact with the mold 1. After the water cooling blocks 6a and 6b are made into contact with the mold 1, the mold 1 is cooled at varying cooling rates as represented by the real line. The cooling rate immediately after the water cooling blocks 6a and 6b are made into contact with the mold 1 as represented by the real line is higher than the cooling rate immediately after the mold 1 is made into contact with the water cooling block 6 as represented by the long-dashed short-dashed line.

It should be noted that the mold 1 is extremely rapid-cooled until the temperature of the mold 1 is dropped down to the solidifying point as represented by the real line. Namely, as shown in FIGS. 5A and 5B, moving the water-cooling blocks 6a and 6b to contact with the mold 1 causes an extremely rapid temperature drop of the mold 1 until the temperature of the mold 1 is dropped down to the solidifying point as represented by the real line.

If the mold 1 is moved slowly from the heating position to the cooling position, the temperature of the mold 1 can be dropped down to the solidifying point before the mold 1 is made into contact with the water-cooling block 6. This process is not preferable to realize a rapid cooling of the molten thermoelectric raw material filled in the cavity of the mold 1. Preferably, the mold 1 is moved quickly from the heating position to the cooling position so that the mold 1 is made into contact with the water-cooling block 6 before the temperature of the mold 1 is dropped down to the solidifying point. This process is preferable to realize a rapid cooling of the molten thermoelectric raw material filled in the cavity of the mold 1.

Second Embodiment

Figure 7A:
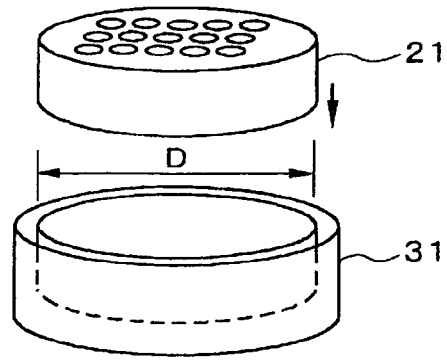
FIGS. 7A and 7E are views illustrating sequential steps involved in a method of forming a thermoelectric device in accordance with a second preferred embodiment of the present invention.

A second embodiment of the present invention will be described in detail. A method of forming a thermoelectric device is provided. FIGS. 7A and 7E are views illustrating sequential steps involved in a method of forming a thermoelectric device in accordance with a second preferred embodiment of the present invention. A thermoelectric material is prepared which can have a composition comprising at least one of Bi and Sb and at least one of Te and Se.

As shown in FIG. 7A, a pair of first and second molds 31 and 21 can be used. The first mold 31 can have a cylindrically shaped cavity that has a predetermined diameter D and a predetermined cavity depth. The cavity depth corresponds to a height of the cavity. The cavity depth is a dimension of the cavity, which is defined in a direction parallel to a center axis of the cylindrical shape of the cavity. The second mold 21 can have a cylindrical outer shape that is defined by the shape of the cavity of the first mold 31. The second mold 21 has an array of holes that extends in a direction parallel to the center axis of the cylindrical outer shape. The second mold 21 can be engaged with the cavity of the first mold 31. Preferably, the second mold 21 has a higher thermal conductivity than the thermoelectric material. More preferably, the first and second molds 31 and 21 are higher in thermal conductivity than the thermoelectric material. Each of the holes of the second mold 21 has a shape that defines a predetermined shape of the thermoelectric device. Each of the holes of the second mold 21 also has a dimension that defines a predetermined dimension of the thermoelectric device.

A raw material is weighed to prepare a weighed thermoelectric raw material 20 which has a predetermined composition. The thermoelectric raw material 20 is filled in the holes of the second mold 21 engaged within the cavity of the first mold 31 so that the thermoelectric raw material 20 has a height H that corresponds to a depth. The height H of the thermoelectric raw material 20 satisfies a condition that an aspect ratio (D/H) of the diameter D to the height H is equal to or greater than 1, where the diameter D is a diameter of the cylindrically shaped cavity of the first mold 31. Namely, the condition $D/H \geqq 1$ is satisfied. Needless to say, the height H is shallower than the predetermined hole depth.

With reference again to FIG. 1A, the pair of the first and second molds 31 and 21 that contains the thermoelectric raw material 20 is loaded into the vacuum chamber 2. The pair of the first and second molds 31 and 21 is elevated up to the heater section by the elevation rod 7 so that the pair of the first and second molds 31 and 21 is adjacent to the heater 5. The vacuum chamber 2 is vacuumed to a vacuum pressure of, for example, at most 0.133 Pa which is equivalent to 1E-3 Torr. An inert gas such as Ar gas or $N_2$ gas is introduced through the gas introduction port 3 into the vacuum chamber 2. The pair of the first and second molds 31 and 21 is then heated up to a temperature of at least 700° C. by the heater 5 so as to melt the thermoelectric raw material 20 in the holes of the second mold 21 to form a molten thermoelectric raw material 20 in each of the holes of the second mold 21.

With reference again to FIG. 1B, the pair of the first and second molds 31 and 21 is then elevated down to the cooling section of the vacuum chamber 2 by the elevation rod 7 so that the pair of the first and second molds 31 and 21 is thermally engaged with the water-cooling block 6. For example, a bottom of the first mold 31 is in contact with or adjacent to the water-cooling block 6.

The molten thermoelectric raw material 20 in each of the holes of the second mold 21 is rapidly and unidirectionally cooled by the water-cooling block 6 that is in contact with or adjacent to the bottom of the first mold 31. The cooling direction is parallel to an upward direction from the bottom portion of the molten thermoelectric raw material 20 to the top portion thereof. Unidirectional rapid cooling process causes a rapid unidirectional solidification of the molten thermoelectric raw material 20. For example, the unidirectional rapid cooling process can preferably be carried out at a cooling rate of at least 600° C./min. at any positions of the molten thermoelectric raw material 8a. The rapid cooling or the high cooling rate causes rapid solidification and crystallization of the molten thermoelectric raw material 20. The rapid solidification and crystallization can form crystal chips of thermoelectric material 20 that include small crystal grains. The crystal chips of thermoelectric material 20 are defined by the holes of the second mold 21. The small crystal grains provide a high mechanical strength of the crystal chip of thermoelectric material. The cooling rate has no significant upper, limit but can be limited by an actually available maximum cooling rate. Preferably, the cooling rate can typically be, but is not limited to, equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

Figure 7B:
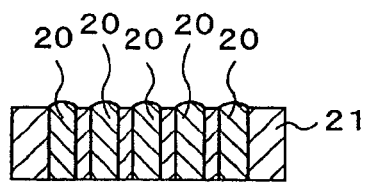
Figure 7C:
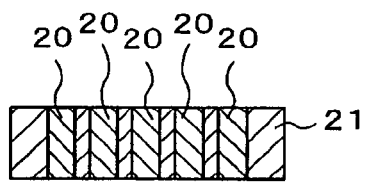

With reference to FIG. 7B, after the solidification process is completed, the pair of the first and second mold 31 and 21 is unloaded from the vacuum chamber 2. If top portions of the crystal chips of thermoelectric material 20 are projected from the holes of the second mold 21, then with reference to FIG. 7C the projecting portions of the crystal chips of thermoelectric material 20 are polished so that the tops of the crystal chips of thermoelectric material 20 are leveled to a top surface of the second mold 21.

Figure 7D:
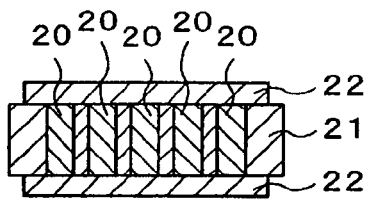
Figure 7E:
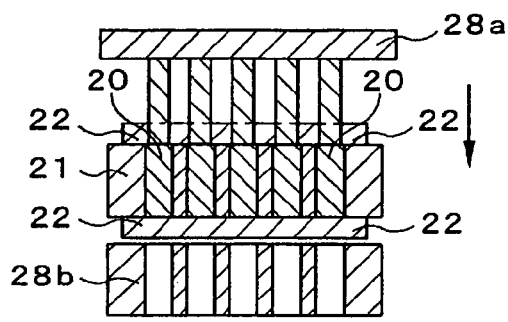

With reference to FIG. 7D, plated layers 22 are formed on the opposite surfaces of the second mold 21 and exposed surfaces of the crystal chips of thermoelectric material 20, thereby forming thermoelectric devices in the holes of the second mold 21. The plated layers 22 perform as barrier layers of the thermoelectric devices. The plated layers 22 can be made of Ni. In a case, a resist mask can be formed, which covers the surface of the second mold 21 so that the crystal chips of thermoelectric material are exposed. The resist mask can be formed using a photolithography technique. The plated layers 22 can selectively formed on the exposed surfaces of the crystal chips of thermoelectric material 20 in the holes of the second mold 21 by using the resist mask. When the plated layers 22 are formed on the exposed surfaces of the crystal chips of thermoelectric material 20 in the holes of the second mold 21, it is preferable for the second mold 21 to have an electrical conductivity.

With reference to FIG. 7E, a pair of punching jigs 28a and 28b is used to punch and extrude the thermoelectric devices from the holes of the second mold 21.

First and second substrates are prepared, each of which has an array of electrodes. A first plurality of thermoelectric devices is mounted on the first substrate so that the plated layers 22 of the thermoelectric devices are made into contact with the electrodes of the first substrate. Namely, a first array of the thermoelectric devices is thus formed over the first substrate. A second plurality of thermoelectric devices is mounted on the second substrate so that the plated layers 22 of the thermoelectric devices are made into contact with the electrodes of the second substrate. Namely, a second array of the thermoelectric devices is thus formed over the second substrate. The first and second pluralities of the thermoelectric devices mounted on the first and second substrates are then bonded using the known bonding technique, thereby completing a thermoelectric module, wherein the p-type and n-type thermoelectric devices are alternately connected in series.

In accordance with the method of preparing the thermoelectric material, the solidification of the molten thermoelectric raw material can be realized by carrying out a rapid cooling process at a cooling rate of at least 600° C./min. that is higher than that of the conventional cooling process. The rapid cooling process at the high cooling rate of at least 600° C./min. causes a rapid solidification and crystallization of the molten thermoelectric raw material. The rapid solidification and crystallization can thereby form a crystal of thermoelectric material that contains small crystal grains. The small crystal grains of the crystal of thermoelectric material provide a high mechanical strength. The high mechanical strength can provide a high machinability of the crystal of thermoelectric material. The rapid solidification and crystallization at the cooling rate of at least 600° C./min. can form the crystal of thermoelectric material that contains small crystal grains. The small crystal grains provide a high machinability of the crystal of thermoelectric material. Increasing the cooling rate reduces the crystal grain size average. Reducing the crystal grain size average increases the machinability of the crystal of thermoelectric material. Increasing the machinability of the crystal of thermoelectric material improves the yield of the thermoelectric device or the thermoelectric module. The cooling rate has no significant upper limit but can be limited by an actually available maximum cooling rate.

Preferably, the cooling rate can typically be, but is not limited to, equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

Meanwhile, as described above, at least one of the opposite surfaces of the first mold 31, for example, at least one of top and bottom surfaces of the first mold 31 can be thermally engaged with a cooler. Namely, at least one of the top and bottom surfaces of the first mold 31 can be exposed to or can be made into contact with the water cooling block so that the molten thermoelectric raw material is cooled in a uniaxial direction. The molten thermoelectric raw material can be uniaxially cooled in either a single cooling direction or two cooling directions that are antiparallel to each other. The uniaxial cooling process can cause a uniaxial solidification or crystallization of the molten thermoelectric raw material. The uniaxial solidification or crystallization can provide a uniaxial orientation to the crystal structure of the thermoelectric material. The uniaxial orientation to the crystal structure provides a high power factor to the crystal of thermoelectric material.

The uniaxial orientation of the crystal structure of thermoelectric material depends on not only the uniaxial cooling direction but also the above-described aspect ratio (D/H) of the diameter D to the height H of the molten thermoelectric raw material in the holes of the second mold 21. If the aspect ratio (D/H) is lower than 1, then it is difficult to provide the uniaxial orientation to the crystal structure of thermoelectric material. Carrying out uniaxial and rapid cooling process at the high cooling rate of at least 600° C./min. under the condition that the aspect ratio (D/H) is lower than 1 can form the crystal of thermoelectric material that has a high machinability and a high power factor. The cooling rate has no significant upper limit but can be limited by an actually available maximum cooling rate.

Preferably, the cooling rate can typically be, but is not limited to, equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

The molten thermoelectric material is solidified in the holes of the second mold 21 to form the crystal chips of thermoelectric material in the holes of the second mold 21. Neither slicing process nor dicing process is needed to form the thermoelectric devices. This process reduces the manufacturing cost and improves the yield.

In accordance with this embodiment, the second mold 21 can preferably have an electrical conductivity. The plated layers 22 are formed over the surface of the second mold 21 and the exposed surfaces of the crystal chips of thermoelectric material that are within the holes of the second mold 21. This ensures to prevent the plated layers 22 from being formed on side surfaces of the thermoelectric devices. This improves workability and yield of the manufacturing.

The uniaxial solidification and crystallization process of the molten thermoelectric material can provide a uniaxial orientation to the crystal structure of the thermoelectric material. The uniaxial orientation to the crystal structure provides a high power factor to the crystal of thermoelectric material.

Preferably, the second mold 21 can be higher in thermal conductivity than the thermoelectric material. More preferably, the first and second molds 31 and 21 are higher in thermal conductivity than the thermoelectric material. If the first and/or second molds 31 and 21 are higher in thermal conductivity than the thermoelectric material, a high strength layer can be formed on the peripheral portion of the thermoelectric device.

Figure 8A:
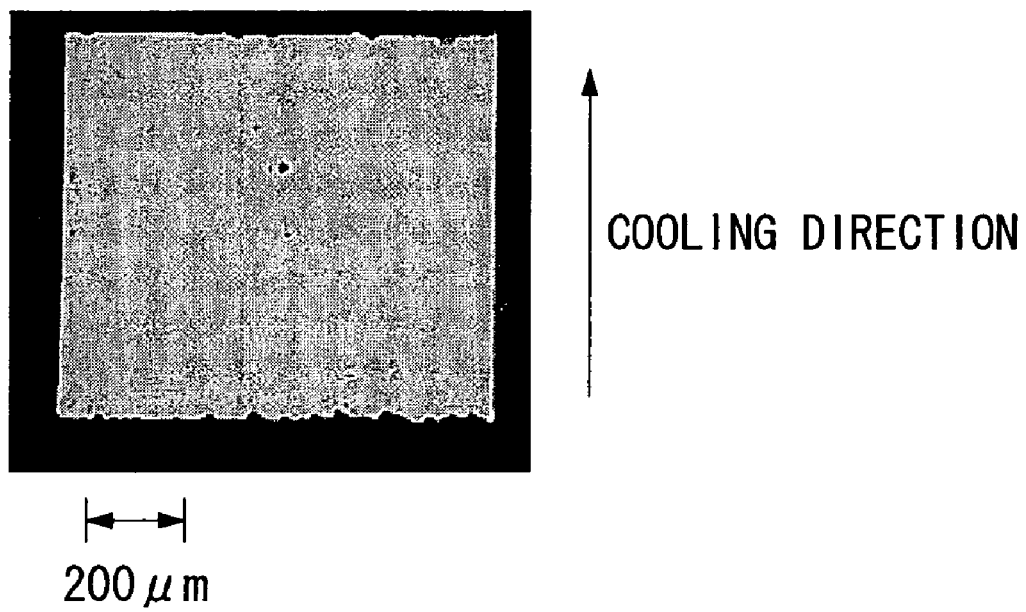
FIG. 8A is a microphotograph of a cross section of the thermoelectric device formed using Ti-based molds in accordance with the method shown in FIGS. 7A through 7E.
Figure 8B:
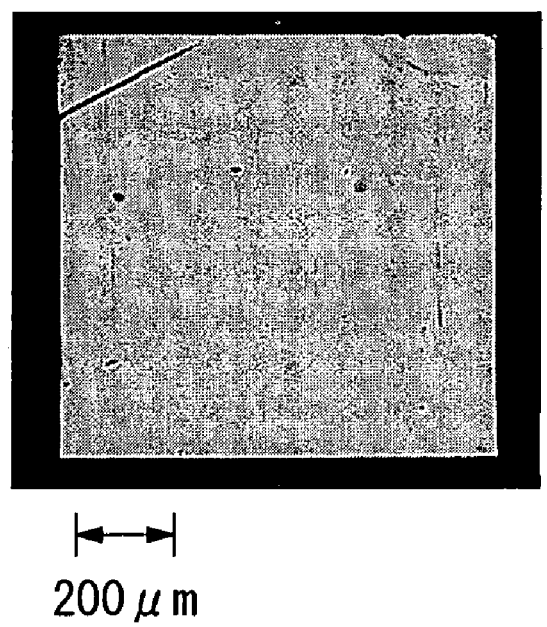
FIG. 8B is a microphotograph of a vertical section of the thermoelectric device formed using Ti-based molds in accordance with the method shown in FIGS. 7A through 7E.

FIG. 8A is a microphotograph of a cross section of the thermoelectric device formed using Ti-based molds in accordance with the method shown in FIGS. 7A through 7E. FIG. 8B is a microphotograph of a vertical section of the thermoelectric device formed using Ti-based molds in accordance with the method shown in FIGS. 7A through 7E. The magnification of the microphotograph is 50 times. The plated layers are formed on opposite surfaces of the thermoelectric material. The first and second molds 31 and 21 are higher in thermal conductivity than the thermoelectric material. The use of the paired first and second molds 31 and 21 being higher in thermal conductivity than the thermoelectric material causes that the crystal chips of thermoelectric material have a peripheral portion that includes smaller crystal grains than crystal grains of the center portion thereof. Reducing the size of the crystal grains increases the strength of the crystal of thermoelectric material. Thus, the peripheral portion of the crystal chips of thermoelectric material is higher in strength than the center portion thereof. This crystal structure provides a higher mechanical strength to the thermoelectric device.

In accordance with the above-described embodiment, the cavity of the first mold 31 has the cylindrical shape. It is possible as a modification for the first mold 31 to have a prismatic shape. The prismatic shape includes a polygonal column shape. The thermoelectric material is filled so that the aspect ratio (D/H) of a diameter D to the depth D is equal to or greater than 1, wherein the diameter D is a maximum diameter of an inscribed circle of an outer periphery of the first mold 31. The first mold 31 can be configured by a top-opened pot which is defined by a bottom wall and a side wall. The second mold 21 can be configured by a mold that has an array of holes, each of which has a shape that defines an outer shape of the thermoelectric device.

In a case, the thermoelectric raw material can be melt in the mold. In another case, the thermoelectric raw material can be melt outside the mold before the molten thermoelectric raw material is then filled in the holes of the second mold 21 so as to satisfy the condition that the aspect ratio (D/H) is equal to or higher than 1.

Third Embodiment

A third embodiment of the present invention will be described in detail. A method of fabricating a thermoelectric module is provided. In the above-described second embodiment, the thermoelectric devise are released from the holes of the second mold 21. The thermoelectric devices are mounted on the substrate, wherein the plated layers 22 are made into contact with the electrodes of the substrate. The p-type and n-type thermoelectric devices are alternately arranged. In accordance with this third embodiment, a substrate applied with a solder is placed under the second mold 21 so that the thermoelectric devices are directly mounted onto the substrate.

Figure 9A:
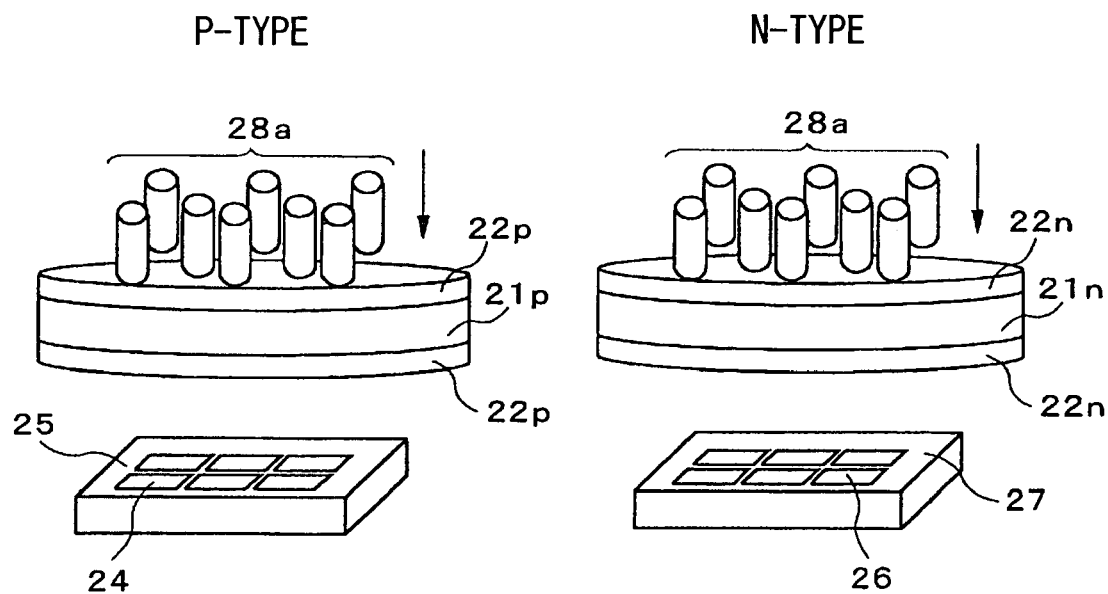
FIGS. 9A and 9B are schematic views illustrating sequential steps involved in a method of fabricating a thermoelectric module in accordance with a third preferred embodiment of the present invention.
Figure 9B:
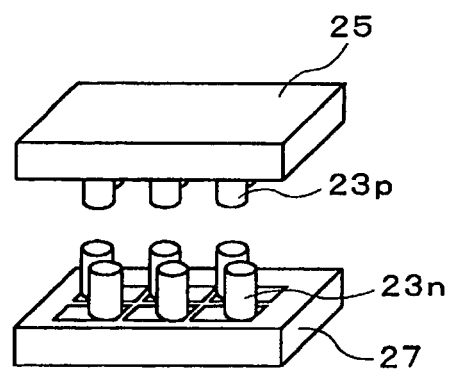

FIGS. 9A and 9B are schematic views illustrating sequential steps involved in a method of fabricating a thermoelectric module in accordance with a third preferred embodiment of the present invention. Sequential process for fabricating the thermoelectric module shown in FIGS. 9A and 9B follows sequential processes for forming the thermoelectric devices that are similar to the above-described sequential processes shown in FIGS. 7A through 7E. A first mold $21p$ having a first array of holes is used. A p-type molten thermoelectric raw material is filled into the first array of holes of the first mold $21p$. The p-type molten thermoelectric raw material in the first array of holes of the first mold $21p$ is then rapidly and uniaxially cooled to form a first array of the crystal chips of p-type thermoelectric material in the first array of holes of the first mold $21p$. A second mold $21n$ having a second array of holes is used. An n-type molten thermoelectric raw material is filled into the second array of holes of the second mold $21n$. The n-type molten thermoelectric raw material in the second array of holes of the second mold $21n$ is then rapidly and uniaxially cooled to form a second array of the crystal chips of n-type thermoelectric material in the second array of holes of the second mold $21n$.

First plated layers $22p$ are formed on opposite surfaces of the first mold $21p$ so that the first plated layers $22p$ cover the exposed surfaces of the crystal chips of p-type thermoelectric material, thereby forming a first array of p-type thermoelectric devices $23p$. Second plated layers $22n$ are formed on opposite surfaces of the second mold $21n$ so that the second plated layers $22n$ cover the exposed surfaces of the crystal chips of n-type thermoelectric material, thereby forming a second array of n-type thermoelectric devices $23n$. A first substrate 25 having a first array of electrodes 24 is prepared. The first array of electrodes 24 corresponds to the first array of holes of the first mold $21p$. A second substrate 27 having a second array of electrodes 26 is prepared. The second array of electrodes 26 corresponds to the second array of holes of the second mold $21n$. A solder is applied on the first and second arrays of electrodes 24 and 26 of the first and second substrates 25 and 27.

With reference to FIG. 9A, the first substrate 25 is placed under the first mold $21p$, wherein the first array of p-type thermoelectric devices $23p$ is aligned to the first array of electrodes 24 of the first substrate 25. The second substrate 27 is placed under the second mold $21n$, wherein the second array of n-type thermoelectric devices $23n$ is aligned to the second array of electrodes 26 of the second substrate 27. A first punching jig $28a$ is used to punch and extrude the first array of p-type thermoelectric devices $23p$ from the first mold $21p$ so that the first array of p-type thermoelectric devices $23p$ is placed on the first array of electrode 24 of the first substrate 25. The first array of p-type thermoelectric devices $23p$ is aligned to the first array of electrode 24 of the first substrate 25. A second punching jig $28b$ is used to punch and extrude the second array of n-type thermoelectric devices $23n$ from the second mold $21n$ so that the second array of n-type thermoelectric devices $23n$ is placed on the second array of electrode 26 of the second substrate 27. The second array of n-type thermoelectric devices $23n$ is aligned to the second array of electrode 26 of the second substrate 27.

A reflow process or a hot-plate process can be used to mount the first array of p-type thermoelectric devices $23p$ on the first array of electrode 24 of the first substrate 25. A further reflow process or a further hot-plate process can be used to mount the second array of n-type thermoelectric devices $23n$ on the second array of electrode 26 of the second substrate 27.

With reference to FIG. 9B, the first and second substrates 25 and 27 are assembled so that the first array of the p-type thermoelectric devices $23p$ mounted on the first array of electrode 24 of the first substrate 25 is bonded to the second array of electrode 26 of the second substrate 27, while the second array of n-type thermoelectric devices $23n$ mounted on the second array of electrode 26 of the second substrate 27 is bonded to the first array of electrode 24 of the first substrate 25, thereby completing the thermoelectric module. The p-type thermoelectric devices $23p$ and the n-type thermoelectric devices $23n$ are alternately connected through the electrodes 24 and 26. Bonding process can be carried out by the reflow process or the hot-plate process. In a case, the first substrate 25 can be positioned under the second substrate 27. In another case, the first substrate 25 can be positioned over the second substrate 27.

In accordance with the third embodiment, the substrate applied with the solder is placed under the mold so that the thermoelectric devices are pushed and extruded from the mold and the thermoelectric devices are arranged directly on the substrate. Thus, it is not necessary to alternately arrange the p-type thermoelectric devices $23p$ and the n-type thermoelectric devices $23n$ over the substrate. This simplifies the fabrication processes and shortens the fabrication time period. Needless to say, the third embodiment provides the same effects and advantages as described in the second embodiment.

The above-described first to third embodiments have been evaluated. The following examples and comparative examples demonstrate advantages of the first to third embodiments have been evaluated as compared to the conventional technique.

EXAMPLE 1

Figure 10A:
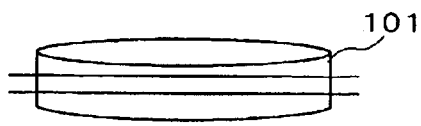
FIGS. 10A through 10E are perspective views illustrating sequential steps involved in a conventional method of fabricating a thermoelectric module.
Figure 10B:
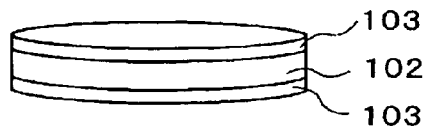
Figure 10C:
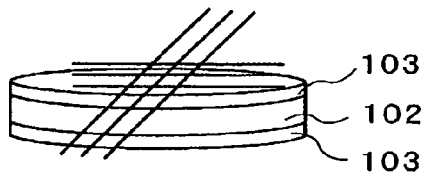
Figure 10D:
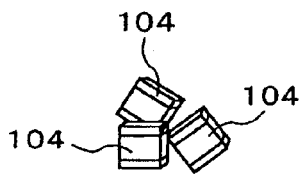
Figure 10E:
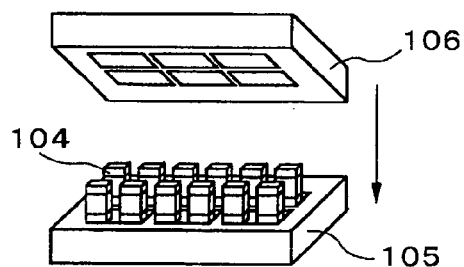

A thermoelectric material was prepared in accordance with the above-described method of preparing the thermoelectric material as described in the first embodiment of the present invention and as shown in FIGS. 1A and 1B. A thermoelectric module was fabricated from the prepared thermoelectric material in accordance with the conventional method shown in FIGS. 10A and 10E.

Preparing Thermoelectric Material:

A thermoelectric raw material was weighed so as to have a predetermined composition that comprises at least one of Bi and Sb and at least one of Te and Se. The weighed thermoelectric raw material was filled in a cavity of a mold to satisfy the condition that the aspect ratio (D/H) is equal to or greater than 1. These weighing and filling processes elapsed 30 minutes.

The mold containing the thermoelectric raw material was heated up to a temperature of at least 700° C. to melt the thermoelectric raw material in the cavity of the mold, thereby forming a molten thermoelectric raw material. The molten thermoelectric raw material in the cavity of the mold was then rapidly and unidirectionally cooled at a cooling rate of at least 600° C./min. at any positions of the molten thermoelectric raw material. The rapid and unidirectional cooling process causes rapid and unidirectional solidification and crystallization of the molten thermoelectric raw material. The rapid and unidirectional solidification and crystallization can form a crystal ingot of thermoelectric material that includes small crystal grains. The crystal ingot of thermoelectric material has a crystal structure having a uniaxial orientation. The small crystal grains provide a high mechanical strength of the crystal ingot of thermoelectric material. These melting and cooling processes elapsed 60 minutes.

Preferably, the cooling rate can typically be, but is not limited to, equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

Forming Thermoelectric Device:

The crystal ingot of thermoelectric material was sliced to form a plurality of wafers of thermoelectric material in the know method. The yield was 87%. This slicing process elapsed 120 minutes.

The plated layers are formed on opposite surfaces of each wafer of the thermoelectric material. This plating process elapsed 60 minutes.

The wafer of thermoelectric material with the plated layers was deiced to form a plurality of chips of thermoelectric material with the plated layers, thereby completing a plurality of thermoelectric devices. The physical yield was 81%. The failure yield was 60%. The physical yield is a yield depending on the dicing margin. The failure yield is a yield depending on an unintended failure or defect that appears in the manufacturing processes, for example, cracking and breaking. This dicing process elapsed 180 minutes.

Fabricating Thermoelectric Module:

The plurality of thermoelectric devices was mounted on a first substrate by handwork or robot work, thereby forming an array of thermoelectric devices over the first substrate. The average mounting rate was 2 minutes per device. In other words, mounting every thermoelectric device elapsed 2 minutes in the average.

A second substrate was bonded to the array of thermoelectric device mounted on the first substrate by using a reflow or a hot plate, thereby forming a thermoelectric module. This bonding process elapsed 5 minutes.

Leads were connected to the thermoelectric module in the known technique. This lead-connecting process elapsed 2 minutes.

The above described sequential processes elapsed 459 minutes in total. The yield of manufacturing the thermoelectric module was 42%.

EXAMPLE 2

A thermoelectric device was prepared in accordance with the above-described method of forming the thermoelectric device as described in the second embodiment of the present invention and shown in FIGS. 7A through 7E. A thermoelectric module was fabricated from the formed thermoelectric device in accordance with the conventional method shown in FIGS. 10D and 10E.

Preparing Thermoelectric Material:

A thermoelectric raw material was weighed so as to have a predetermined composition that comprises at least one of Bi and Sb and at least one of Te and Se. The weighed thermoelectric raw material was filled in holes of a second mold that is engaged in the cavity of the first mold to satisfy the condition that the aspect ratio (D/H) is equal to or greater than 1. These weighing and filling processes elapsed 30 minutes.

The mold containing the thermoelectric raw material was heated up to a temperature of at least 700° C. to melt the thermoelectric raw material in the holes of the second mold engaged in the cavity of the first mold, thereby forming a molten thermoelectric raw material in each hole of the second mold in the cavity of the first mold. The molten thermoelectric raw material in each hole of the second mold engage in the cavity of the first mold was then rapidly and unidirectionally cooled at a cooling rate of at least 600° C./min. at any positions of the molten thermoelectric raw material, thereby forming a plurality of crystal chips of thermoelectric material in the holes of the second mold engaged in the cavity of the first mold. The rapid and unidirectional cooling process causes rapid and unidirectional solidification and crystallization of the molten thermoelectric raw material. The rapid and unidirectional solidification and crystallization can form crystal chips of thermoelectric material that includes small crystal grains. The crystal chips of thermoelectric material have a crystal structure having a uniaxial orientation. The small crystal grains provide a high mechanical strength of the crystal chips of thermoelectric material. These melting and cooling processes elapsed 60 minutes.

Preferably, the cooling rate can typically be, but is not limited to, equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

Forming Thermoelectric Device:

A projecting portion of each of the crystal chips of thermoelectric material that projects from each hole of the second mold is then polished. The yield was 87%. This polishing process elapsed 60 minutes.

The plated layers are formed on the surface of the second mold and exposed surfaces of the crystal chips of thermoelectric material in the holes of the second mold, thereby forming a plurality of thermoelectric devices in the holes of the second mold. This plating process elapsed 60 minutes.

Fabricating Thermoelectric Module:

The plurality of thermoelectric devices was released from the second mold. The plurality of thermoelectric devices was mounted on a first substrate by handwork or robot work, thereby forming an array of thermoelectric devices over the first substrate. The average mounting rate was 2 minutes per device. In other words, mounting every thermoelectric device elapsed 2 minutes in the average.

A second substrate was bonded to the array of thermoelectric devices mounted on the first substrate by using a reflow or a hot plate, thereby forming a thermoelectric module. This bonding process elapsed 5 minutes.

Leads were connected to the thermoelectric module in the known technique. This lead-connecting process elapsed 2 minutes.

The above described sequential processes elapsed 219 minutes in total. The yield of manufacturing the thermoelectric module was 87%.

EXAMPLE 3

A thermoelectric device was prepared in accordance with the above-described method of forming the thermoelectric device as described in the second embodiment of the present invention and shown in FIGS. 7A through 7E. A thermoelectric module was fabricated from the formed thermoelectric device in accordance with the method of fabricating the thermoelectric module as described in the third embodiment of the present invention and shown in FIGS. 9A and 9B.

Preparing Thermoelectric Material:

A thermoelectric raw material was weighed so as to have a predetermined composition that comprises at least one of Bi and Sb and at least one of Te and Se. The weighed thermoelectric raw material was filled in holes of a second mold that is engaged in the cavity of the first mold to satisfy the condition that the aspect ratio (D/H) is equal to or greater than 1. These weighing and filling processes elapsed 30 minutes.

The mold containing the thermoelectric raw material was heated up to a temperature of at least 700° C. to melt the thermoelectric raw material in the holes of the second mold engaged in the cavity of the first mold, thereby forming a molten thermoelectric raw material in each hole of the second mold in the cavity of the first mold. The molten thermoelectric raw material in each hole of the second mold engage in the cavity of the first mold was then rapidly and unidirectionally cooled at a cooling rate of at least 600° C./min. at any positions of the molten thermoelectric raw material, thereby forming a plurality of crystal chips of thermoelectric material in the holes of the second mold engaged in the cavity of the first mold. The rapid and unidirectional cooling process causes rapid and unidirectional solidification and crystallization of the molten thermoelectric raw material. The rapid and unidirectional solidification and crystallization can form crystal chips of thermoelectric material that includes small crystal grains. The crystal chips of thermoelectric material have a crystal structure having a uniaxial orientation. The small crystal grains provide a high mechanical strength of the crystal chips of thermoelectric material. These melting and cooling processes elapsed 60 minutes.

Preferably, the cooling rate can typically be, but is not limited to, equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

Forming Thermoelectric Device:

A projecting portion of each of the crystal chips of thermoelectric material that projects from each hole of the second mold is then polished. The yield was 87%. This polishing process elapsed 60 minutes.

The plated layers are formed on the surface of the second mold and exposed surfaces of the crystal chips of thermoelectric material in the holes of the second mold, thereby forming a plurality of thermoelectric devices in the holes of the second mold. This plating process elapsed 60 minutes.

Fabricating Thermoelectric Module:

A first substrate is placed under the second mold having holes in which the thermoelectric devices are provided. A punching jig is used to punch and extrude the thermoelectric devices from the holes of the second molds, thereby forming an array of thermoelectric devices over the first substrate. The average mounting rate was 1/8 minutes per device. In other words, mounting every eight thermoelectric devices elapsed 1 minute in the average.

A second substrate was bonded to the array of thermoelectric devices mounted on the first substrate by using a reflow or a hot plate, thereby forming a thermoelectric module. This bonding process elapsed 5 minutes.

Leads were connected to the thermoelectric module in the known technique. This lead-connecting process elapsed 2 minutes.

The above described sequential processes elapsed 217 minutes in total. The yield of manufacturing the thermoelectric module was 87%.

COMPARATIVE EXAMPLE 1

A thermoelectric material was prepared in accordance with a conventional method of preparing the thermoelectric material by using a hot press process. A thermoelectric module was fabricated from the prepared thermoelectric material in accordance with the conventional method shown in FIGS. 10A and 10E.

Preparing Thermoelectric Material:

A thermoelectric raw material was weighed so as to have a predetermined composition that comprises at least one of Bi and Sb and at least one of Te and Se. The weighed thermoelectric raw material was filled in a silica tube. These weighing and filling processes elapsed 50 minutes.

The silica tube containing the thermoelectric raw material was heated up to a temperature of at least 700° C. to melt the thermoelectric raw material in the silica tube, thereby forming a molten thermoelectric raw material. The molten thermoelectric raw material in the silica tube was then rapidly and omnidirectionally cooled at a cooling rate of at least 600° C./min. at any positions of the molten thermoelectric raw material. The rapid and omnidirectional cooling process causes rapid and omnidirectional solidification and crystallization of the molten thermoelectric raw material. The rapid and omnidirectional solidification and crystallization can form a bulk of thermoelectric material. These melting and cooling processes elapsed 60 minutes.

Preferably, the cooling rate can typically be, but is not limited to, equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

The bulk of thermoelectric material was then milled by a ball mill. This grinding process elapsed 180 minutes. The yield was 80%.

The hot press process was carried out to form an ingot of thermoelectric material. This hot press process elapsed 180 minutes.

Forming Thermoelectric Device:

The bulk of thermoelectric material was sliced to form a plurality of wafers of thermoelectric material in the know method. The yield was 87%. This slicing process elapsed 120 minutes.

The plated layers are formed on opposite surfaces of each wafer of the thermoelectric material. This plating process elapsed 60 minutes.

The wafer of thermoelectric material with the plated layers was deiced to form a plurality of chips of thermoelectric material with the plated layers, thereby completing a plurality of thermoelectric devices. The physical yield was 81%. The failure yield was 90%. The physical yield is a yield depending on the dicing margin. The failure yield is a yield depending on an unintended failure or defect that appears in the manufacturing processes, for example, cracking and breaking. This dicing process elapsed 180 minutes.

Fabricating Thermoelectric Module:

The plurality of thermoelectric devices was mounted on a first substrate by handwork or robot work, thereby forming an array of thermoelectric devices over the first substrate. The average mounting rate was 2 minutes per device. In other words, mounting every thermoelectric device elapsed 2 minutes in the average.

A second substrate was bonded to the array of thermoelectric device mounted on the first substrate by using a reflow or a hot plate, thereby forming a thermoelectric module. This bonding process elapsed 5 minutes.

Leads were connected to the thermoelectric module in the known technique. This lead-connecting process elapsed 2 minutes.

The above described sequential processes elapsed 839 minutes in total. The yield of manufacturing the thermoelectric module was 51%.

COMPARATIVE EXAMPLE 2

A thermoelectric material was prepared in accordance with another conventional method of preparing the thermoelectric material by using a unidirectional solidification. A thermoelectric module was fabricated from the prepared thermoelectric material in accordance with the conventional method shown in FIGS. 10A and 10E.

Preparing Thermoelectric Material:

A thermoelectric raw material was weighed so as to have a predetermined composition that comprises at least one of Bi and Sb and at least one of Te and Se. The weighed thermoelectric raw material was filled in a silica tube. These weighing and filling processes elapsed 50 minutes.

The silica tube containing the thermoelectric raw material was heated up to a temperature of at least 700° C. to melt the thermoelectric raw material in the silica tube, thereby forming a molten thermoelectric raw material. The molten thermoelectric raw material in the silica tube was then slowly and unidirectionally cooled at a cooling rate of less than 600° C./min. at any positions of the molten thermoelectric raw material. The slow and unidirectional cooling process causes slow and unidirectional solidification and crystallization of the molten thermoelectric raw material. The slow and unidirectional solidification and crystallization can form a bulk of thermoelectric material. These melting and cooling processes elapsed 180 minutes. Preferably, the cooling rate can typically be, but is not limited to, equal to or less than 60,000° C./min. If the cooling rate is substantially greater than 60,000° C./min., an amorphous ingot of thermoelectric material can be formed. In order to ensure that the crystal ingot of thermoelectric material be formed, it is preferable that the cooling rate is equal to or less than 60,000° C./min.

Forming Thermoelectric Device:

The bulk of thermoelectric material was sliced to form a plurality of wafers of thermoelectric material in the know method. The yield was 87%. This slicing process elapsed 120 minutes.

The plated layers are formed on opposite surfaces of each wafer of the thermoelectric material. This plating process elapsed 60 minutes.

The wafer of thermoelectric material with the plated layers was deiced to form a plurality of chips of thermoelectric material with the plated layers, thereby completing a plurality of thermoelectric devices. The physical yield was 81%. The failure yield was 40%. The physical yield is a yield depending on the dicing margin. The failure yield is a yield depending on an unintended failure or defect that appears in the manufacturing processes, for example, cracking and breaking. This dicing process elapsed 180 minutes.

Fabricating Thermoelectric Module:

The plurality of thermoelectric devices was mounted on a first substrate by handwork or robot work, thereby forming an array of thermoelectric devices over the first substrate. The average mounting rate was 2 minutes per device. In other words, mounting every thermoelectric device elapsed 2 minutes in the average.

A second substrate was bonded to the array of thermoelectric device mounted on the first substrate by using a reflow or a hot plate, thereby forming a thermoelectric module. This bonding process elapsed 5 minutes.

Leads were connected to the thermoelectric module in the known technique. This lead-connecting process elapsed 2 minutes.

The above described sequential processes elapsed 599 minutes in total. The yield of manufacturing the thermoelectric module was 28%.

Evaluations:

In accordance with Comparative Examples 1 and 2, the thermoelectric raw material was melt in the silica tube. Use of the silica tube in Comparative Examples 1-2 needs a longer time that elapses to vacuum the silica tube as compared to Examples 1-3. The silica tube is disposable type element. This may increase the manufacturing cost.

In accordance with Comparative Example 1, each of the milling process and the hot press process elapses 180 minutes. This increases the manufacturing time. The yield of the milling process using the ball mill was 80%.

In accordance with Comparative Example 2, the molten thermoelectric raw material was slowly and unidirectionally cooled, thereby forming a bulk of thermoelectric material that includes segregation. The segregation drops the yield of chips of thermoelectric material. The slow cooling process elapses much longer time as compared to the rapid cooling process.

In accordance with Examples 1 and 2, the process for preparing the thermoelectric material elapses 90 minutes in total, which is shorter than the necessary times for preparing the thermoelectric material in accordance with Comparative Examples 1 and 2.

In accordance with Example 1 and Comparative Examples 1 and 2, the process for forming the thermoelectric device elapses 360 minutes in total. The dicing process elapses 180 minutes.

In accordance with Examples 2 and 3, the thermoelectric devices are formed in the holes of the mold, and no dicing process is carried out. Thus, the process for forming the thermoelectric device without carrying out dicing process elapses 120 minutes in total. Further, the process for forming the thermoelectric device without carrying out dicing process improves the yield.

In accordance with Example 1, the molten thermoelectric raw material is rapidly cooled to form a crystal ingot of thermoelectric material that contains smaller crystal grains that provide a higher mechanical strength to the crystal ingot of thermoelectric material. The higher mechanical strength improves the yield in the dicing process as compared to Comparative Example 2.

In accordance with Example 1 and Comparative Examples 1 and 2, the yield of 87% in the slicing process depends on the slicing margin.

In accordance with Examples 2 and 3, the yield of 87% in the polishing process depends on the polishing margin.

In accordance with Example 1 and Comparative Examples 1 and 2, the physical yield of 81% in the dicing process depends on the dicing margin.

In accordance with Example 1 and Comparative Examples 1 and 2, the mounting rate of mounting the thermoelectric devices on the substrate is 2 minutes per device. Namely, mounting every thermoelectric device on the substrate elapses 2 minutes.

In accordance with Examples 2 and 3, the mounting rate of mounting the thermoelectric devices on the substrate is 1/8 minutes per device. Namely, mounting every eight thermoelectric devices on the substrate elapses 1 minute. This process for fabricating the thermoelectric module shortens the necessary time for fabricating the thermoelectric module.

In accordance with Examples 1-3, the above described sequential processes shorten the total manufacturing time as compared to Comparative Examples 1 and 2.

In accordance with Examples 1 and 2, the above described sequential processes improve the total yield up to 87%.

In accordance with Examples 1-3 and Comparative Examples 1 and 2, the thermoelectric material having a composition of $BiO_{0.4}Sb_{1.6}Te_3$ was used to form the thermoelectric device. The thermoelectric device was then subjected to measurements of physical parameters, namely, Seebeck coefficient, electric resistivity, thermal conductivity, power factor (P.F.), performance index, and compressive strength.

In accordance with Example 1, the thermoelectric device has a Seebeck coefficient of $-202$ ($\mu V/K$), an electric resistivity of 1.02E-5 ($\Omega m$), a thermal conductivity of 1.50 (W/mK), a power factor (P.F.) of 4.00E-3 (W/mK$^2$), a performance index of 2.67E-3 (/K), and a compressive strength of 10.4 (kgf/mm$^2$).

In accordance with Examples 2 and 3, each of the thermoelectric devices has a Seebeck coefficient of $-200$ ($\mu V/K$), an electric resistivity of 1.00E-5 ($\Omega m$), a thermal conductivity of 1.49 (W/mK), a power factor (P.F.) of 4.00E-3 (W/mK$^2$), a performance index of 2.68E-3 (/K), and a compressive strength of 12.5 (kgf/mm$^2$).

In accordance with Comparative Example 1, the thermoelectric device has a Seebeck coefficient of $-203$ ($\mu V/K$), an electric resistivity of 1.35E-5 ($\Omega m$), a thermal conductivity of 1.21 (W/mK), a power factor (P.F.) of 3.05E-3 (W/mK$^2$), a performance index of 2.52E-3 (/K), and a compressive strength of 18.6 (kgf/mm$^2$).

In accordance with Comparative Example 2, the thermoelectric device has a Seebeck coefficient of $-198$ ($\mu V/K$), an electric resistivity of 0.92E-5 ($\Omega m$), a thermal conductivity of 1.56 (W/mK), a power factor (P.F.) of 4.26E-3 (W/mK$^2$), a performance index of 2.73E-3 (/K), and a compressive strength of 8.8 (kgf/mm$^2$).

In accordance with Examples 1-3, the thermoelectric devices are higher in power factor (P.F.) than the thermoelectric device of Comparative Example 1, and also higher in compressive strength than the thermoelectric device of Comparative Example 2. In accordance with Examples 1-3, the thermoelectric devices are as high in performance index as the thermoelectric device of Comparative Example 2. Thus, the thermoelectric devices in accordance with Examples 1-3 are excellent in both the thermoelectric performances and the mechanical strength.

EXAMPLE 4

A thermoelectric material was prepared in accordance with the method described in the first embodiment of the present invention. The thermoelectric raw material was filled in the cavity of the mold 1 at the depth or height (H) of 10 millimeters, wherein the aspect ratio (D/H) is 2.5. The molten thermoelectric raw material in the cavity of the mold 1 is rapidly and unidirectionally cooled from the bottom of the mold 1. The power factor (P.F.) of the thermoelectric device was measured. The measured power factor (P.F.) is greater than the criteria value of 4.0E-3 (W/mK$^2$).

EXAMPLE 5

A thermoelectric material was prepared in accordance with the method described in the first embodiment of the present invention. The thermoelectric raw material was filled in the cavity of the mold 1 at the depth or height (H) of 10 millimeters, wherein the aspect ratio (D/H) is 2. The molten thermoelectric raw material in the cavity of the mold 1 is rapidly and unidirectionally cooled from the bottom of the mold 1. The power factor (P.F.) of the thermoelectric device was measured. The measured power factor (P.F.) is greater than the criteria value of 4.0E-3 (W/mK$^2$).

EXAMPLE 6

A thermoelectric material was prepared in accordance with the method described in the first embodiment of the present invention. The thermoelectric raw material was filled in the cavity of the mold 1 at the depth or height (H) of 10 millimeters, wherein the aspect ratio (D/H) is 1.2. The molten thermoelectric raw material in the cavity of the mold 1 is rapidly and unidirectionally cooled from the bottom of the mold 1. The power factor (P.F.) of the thermoelectric device was measured. The measured power factor (P.F.) is greater than the criteria value of 4.0E-3 (W/mK$^2$).

EXAMPLE 7

A thermoelectric material was prepared in accordance with the method described in the first embodiment of the present invention. The thermoelectric raw material was filled in the cavity of the mold 1 at the depth or height (H) of 20 millimeters, wherein the aspect ratio (D/H) is 2. The molten thermoelectric raw material in the cavity of the mold 1 is rapidly and bidirectionally cooled from the top and bottom of the mold 1. The power factor (P.F.) of the thermoelectric device was measured. The measured power factor (P.F.) is greater than the criteria value of 4.0E-3 (W/mK$^2$).

COMPARATIVE EXAMPLE 3

A thermoelectric material was prepared in accordance with a method similar to the above-described method in the first embodiment of the present invention. The thermoelectric raw material was filled in the cavity of the mold 1 at the depth or height (H) of 10 millimeters, wherein the aspect ratio (D/H) is 0.8. The molten thermoelectric raw material in the cavity of the mold 1 is rapidly and unidirectionally cooled from the bottom of the mold 1. The power factor (P.F.) of the thermoelectric device was measured. The upper and center portions of the thermoelectric device are smaller in power factor (P.F.) than the criteria value of 4.0E-3 (W/mK$^2$). The lower portion of the thermoelectric device is higher in power factor (P.F.) than the criteria value of 4.0E-3 (W/mK$^2$).

COMPARATIVE EXAMPLE 4

A thermoelectric material was prepared in accordance with a method similar to the above-described method in the first embodiment of the present invention. The thermoelectric raw material was filled in the cavity of the mold 1 at the depth or height (H) of 15 millimeters, wherein the aspect ratio (D/H) is 2. The molten thermoelectric raw material in the cavity of the mold 1 is rapidly and unidirectionally cooled from the bottom of the mold 1. The power factor (P.F.) of the thermoelectric device was measured. The upper portion of the thermoelectric device is smaller in power factor (P.F.) than the criteria value of 4.0E-3 (W/mK$^2$). The center and lower portions of the thermoelectric device are higher in power factor (P.F.) than the criteria value of 4.0E-3 (W/mK$^2$).

COMPARATIVE EXAMPLE 5

A thermoelectric material was prepared in accordance with a method similar to the above-described method in the first embodiment of the present invention. The thermoelectric raw material was filled in the cavity of the mold 1 at the depth or height (H) of 30 millimeters, wherein the aspect ratio (D/H) is 2. The molten thermoelectric raw material in the cavity of the mold 1 is rapidly and bidirectionally cooled from the top and bottom of the mold 1. The power factor (P.F.) of the thermoelectric device was measured. The center portion of the thermoelectric device is smaller in power factor (P.F.) than the criteria value of 4.0E-3 (W/mK$^2$). The upper and lower portions of the thermoelectric device are higher in power factor (P.F.) than the criteria value of 4.0E-3 (W/mK$^2$).

EXAMPLE 8

A thermoelectric material was prepared in accordance with the method described in the second embodiment of the present invention. The thermoelectric raw material was filled in the holes of the second mold 21 at the depth or height (H) of 1 millimeter, wherein the aspect ratio (D/H) of each of the holes is 2.5. The second mold 21 is engaged within the cavity of the first mold 31. The aspect ratio (D/H) of the cavity of the first mold 31 is 10. The molten thermoelectric raw material in each of the holes of the second mold 21 is rapidly and unidirectionally cooled from the bottom of the second mold 21. The power factor (P.F.) of the thermoelectric device was measured. The measured power factor (P.F.) is greater than the criteria value of 4.0E-3 (W/mK$^2$).

EXAMPLE 9

A thermoelectric material was prepared in accordance with the method described in the second embodiment of the present invention. The thermoelectric raw material was filled in the holes of the second mold 21 at the depth or height (H) of 1 millimeter, wherein the aspect ratio (D/H) of each of the holes is 1.11. The second mold 21 is engaged within the cavity of the first mold 31. The aspect ratio (D/H) of the cavity of the first mold 31 is 10. The molten thermoelectric raw material in each of the holes of the second mold 21 is rapidly and unidirectionally cooled from the bottom of the second mold 21. The power factor (P.F.) of the thermoelectric device was measured. The measured power factor (P.F.) is greater than the criteria value of 4.0E-3 (W/mK$^2$).

EXAMPLE 10

A thermoelectric material was prepared in accordance with the method described in the second embodiment of the present invention. The thermoelectric raw material was filled in the holes of the second mold 21 at the depth or height (H) of 1 millimeter, wherein the aspect ratio (D/H) of each of the holes is 0.8. The second mold 21 is engaged within the cavity of the first mold 31. The aspect ratio (D/H) of the cavity of the first mold 31 is 10. The molten thermoelectric raw material in each of the holes of the second mold 21 is rapidly and unidirectionally cooled from the bottom of the second mold 21. The power factor (P.F.) of the thermoelectric device was measured. The measured power factor (P.F.) is greater than the criteria value of 4.0E-3 (W/mK$^2$).

From the results of Examples 8-10, it is demonstrated that the higher power factor (P.F.) is obtained, but is independent from the aspect ratio (D/H) of each of the holes of the second mold 21.

COMPARATIVE EXAMPLE 6

A thermoelectric material was prepared in accordance with the method described in the second embodiment of the present invention. The thermoelectric raw material was filled in the holes of the second mold 21 at the depth or height (H) of 1 millimeter, wherein the aspect ratio (D/H) of each of the holes is 2. The second mold 21 is engaged within the cavity of the first mold 31. The aspect ratio (D/H) of the cavity of the first mold 31 is 0.9. The molten thermoelectric raw material in each of the holes of the second mold 21 is rapidly and unidirectionally cooled from the bottom of the second mold 21. The power factor (P.F.) of the thermoelectric device was measured. The measured power factor (P.F.) is smaller than the criteria value of 4.0E-3 (W/mK$^2$). From comparing the results of Examples 8-10 and Comparative Example 6, it is demonstrated that the higher power factor (P.F.) can be obtained depending on the aspect ratio (D/H) of the cavity of the first mold 31, but is independent from the aspect ratio (D/H) of each of the holes of the second mold 21.

As used herein, the following directional terms "forward, rearward, above, downward, upward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about,", "approximately" and "generally" as used herein mean a reasonable amount of deviation of the modified term such that the end result is not significantly changed. For example, these terms can be construed as including a deviation of at least ±5 percents of the modified term if this deviation would not negate the meaning of the word it modifies.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of preparing a thermoelectric material, the method comprising:
   filling a thermoelectric raw material into a cavity of a first mold so that the thermoelectric raw material filled in the cavity has a width in a first direction and a height in an axial direction, the axial direction being generally perpendicular to the first direction, the width being equal to or greater than the height; and
   applying primary cooling, at a cooling rate of at least 600° C./min., to the thermoelectric raw material filled in the cavity in the axial direction such that an orientation of a crystal structure of the resultant thermoelectric material is unidirectional.

2. The method according to claim 1, wherein the thermoelectric raw material comprises at least one of Bi and Sb and at least one of Te and Se.

3. The method according to claim 1, wherein the cavity has a three-dimensional shape that is defined by first and second finite planes and at least one side surface, the first and second finite planes extend orthogonal to the axial direction, the first and second finite planes are distanced from each other in the axial direction.

4. The method according to claim 3, wherein the cavity has a generally cylindrical shape that has a first center axis, the first center axis is parallel to the axial direction, the cavity defines the thermoelectric raw material into a generally cylindrical shape, the width corresponds to a diameter of the generally cylindrical shape of the thermoelectric raw material, and the height corresponds to a height of the generally cylindrical shape of the thermoelectric raw material.

5. The method according to claim 3, wherein the cavity has a generally prismatic shape that has a first center axis, the first center axis is parallel to the axial direction, the cavity defines the thermoelectric raw material into a generally prismatic shape, the width corresponds to a maximum diameter of an inscribed circle of the generally prismatic shape of the thermoelectric raw material, and the height corresponds to a height of the generally prismatic shape of the thermoelectric raw material.

6. The method according to claim 1, wherein the primary cooling is unidirectional, and the height dimension is at most 10 millimeters.

7. The method according to claim 1, wherein the primary cooling is bidirectional in directions that are opposite to each other, and the height dimension is at most 20 millimeters.

8. The method according to claim 1, wherein filling the thermoelectric raw material comprises filling a molten state of the thermoelectric raw material.

9. The method according to claim 1, wherein filling the thermoelectric raw material comprises filling a solid state of the thermoelectric raw material, and the method further comprises:
   melting the solid state of the thermoelectric raw material filled in the cavity to prepare a molten state of the thermoelectric raw material before cooling the molten state of the thermoelectric raw material.

10. The method according to claim 1, further comprising:
    setting a second mold in the cavity of the first mold so as to thermally engage the second mold with the first mold, the second mold having at least one hole, and wherein filling the thermoelectric raw material comprises filling the thermoelectric raw material into the at least one hole.

11. The method according to claim 10, wherein the second mold is higher in thermal conductivity than the thermoelectric material.

12. A method of forming a thermoelectric device, the method comprising:
    filling a thermoelectric raw material into a cavity of a first mold so that the thermoelectric raw material filled in the cavity has a width in a first direction and a height in an axial direction, the axial direction being generally perpendicular to the first direction, the width being equal to or greater than the height;
    applying primary cooling, at a cooling rate of at least 600° C./min., to the thermoelectric raw material filled in the cavity in the axial direction, so as to prepare a solid state of thermoelectric material having a crystal structure with unidirectional orientation; and preparing a thermoelectric device from a solid state of thermoelectric material.

13. The method according to claim 12, wherein the solid state of thermoelectric material comprises an ingot of thermoelectric material, and
    wherein preparing the thermoelectric device comprises:
    slicing the ingot of thermoelectric material into a wafer of thermoelectric material;
    forming at least one conductive layer on at least one surface of the wafer of thermoelectric material; and
    cutting the wafer of thermoelectric material with the at least one conductive layer into at least one chip.

14. The method according to claim 12, wherein the thermoelectric raw material comprises at least one of Bi and Sb and at least one of Te and Se.

15. The method according to claim 12, wherein the cavity has a three-dimensional shape that is defined by first and second finite planes and at least one side surface, the first and second finite planes extend orthogonal to the axial direction, the first and second finite planes are distanced from each other in the axial direction.

16. The method according to claim 15, wherein the cavity has a generally cylindrical shape that has a first center axis, the first center axis is parallel to the axial direction, the cavity defines the thermoelectric raw material into a generally cylindrical shape, the width corresponds to a diameter of the generally cylindrical shape of the thermoelectric raw material, and the height corresponds to a height of the generally cylindrical shape of the thermoelectric raw material.

17. The method according to claim 15, wherein the cavity has a generally prismatic shape that has a first center axis, the first center axis is parallel to the axial direction, the cavity defines the thermoelectric raw material into a generally prismatic shape, the width corresponds to a maximum diameter of an inscribed circle of the generally prismatic shape of the thermoelectric raw material, and the height corresponds to a height of the generally prismatic shape of the thermoelectric raw material.

18. The method according to claim 12, wherein the primary cooling is unidirectional, and the height dimension is at most 10 millimeters.

19. The method according to claim 12, wherein the primary cooling is bidirectional in directions that are opposite to each other, and the height dimension is at most 20 millimeters.

20. The method according to claim 12, wherein filling the thermoelectric raw material comprises filling a molten state of the thermoelectric raw material.

21. The method according to claim 12, wherein filling the thermoelectric raw material comprises filling a solid state of the thermoelectric raw material, and the method further comprises:
melting the solid state of the thermoelectric raw material filled in the cavity to prepare a molten state of the thermoelectric raw material before cooling the molten state of the thermoelectric raw material.

22. The method according to claim 21, further comprising:
setting a second mold in the cavity of the first mold so as to thermally engage the second mold with the first mold, the second mold having at least one hole, and
wherein filling the thermoelectric raw material comprises filling the thermoelectric raw material into the at least one hole,
the solid state of thermoelectric material comprises a chip of thermoelectric material in the at least one hole, and
preparing the thermoelectric device comprises: forming at least one conductive layer on at least one exposed surface of the chip of thermoelectric material in the at least one hole so as to form a thermoelectric device in the at least one hole.

23. The method according to claim 22, further comprising:
polishing, after cooling the thermoelectric material in the at least one hole, a protruding portion of the thermoelectric material, the protruding portion protruding from the at least one hole.

24. The method according to claim 22, wherein the second mold is higher in thermal conductivity than the thermoelectric material.

25. A method of fabricating a thermoelectric module, the method comprising:
filling a thermoelectric raw material into a cavity of a first mold so that the thermoelectric raw material filled in the cavity has a width in a first direction and a height in an axial direction, the axial direction being generally perpendicular to the first direction, the width being equal to or greater than the height;
applying primary cooling, at a cooling rate of at least 600° C./min., to the thermoelectric raw material filled in the cavity in the axial direction, so as to prepare a solid state of thermoelectric material having a crystal structure with unidirectional orientation;
preparing a plurality of thermoelectric devices from a solid state of thermoelectric material;
preparing first and second substrates that have first and second arrays of electrodes, respectively;
mounting the plurality of thermoelectric devices on at least one of the first and second arrays of electrodes; and
combining the first and second substrates together so as to inter-connect the first and second arrays of electrodes to each other through the plurality of thermoelectric devices.

26. The method according to claim 25, wherein the plurality of thermoelectric devices comprises a first sub-plurality of first conductivity type thermoelectric devices and a second sub-plurality of second conductivity type thermoelectric devices, and mounting the plurality of thermoelectric devices comprises:
mounting the first sub-plurality of first conductivity type thermoelectric devices on the first array of electrodes of the first substrate; and
mounting the second sub-plurality of first conductivity type thermoelectric devices on the second array of electrodes of the second substrate.

27. The method according to claim 26, wherein combining the first and second substrates together comprises combining the first and second substrates together so that a first pair of the first and second conductivity type thermoelectric devices is connected to a first one of the first array of electrodes, a second pair of the first and second conductivity type thermoelectric devices is connected to a second one of the first array of electrodes, the first and second ones are positioned adjacent to each other, and the first conductivity type thermoelectric device included in the first pair and the second conductivity type thermoelectric device included in the second pair are positioned adjacent to each other and connected to a first one of the second array of electrodes.

28. The method according to claim 25, wherein the thermoelectric raw material comprises at least one of Bi and Sb and at least one of Te and Se.

29. The method according to claim 25, wherein the cavity has a three-dimensional shape that is defined by first and second finite planes and at least one side surface, the first and second finite planes extend orthogonal to the axial direction, the first and second finite planes are distanced from each other in the axial direction.

30. The method according to claim 29, wherein the cavity has a generally cylindrical shape that has a first center axis, the first center axis is parallel to the axial direction, the cavity defines the thermoelectric raw material into a generally cylindrical shape, the width corresponds to a diameter of the generally cylindrical shape of the thermoelectric raw material, and the height corresponds to a height of the generally cylindrical shape of the thermoelectric raw material.

31. The method according to claim 29, wherein the cavity has a generally prismatic shape that has a first center axis, the first center axis is parallel to the axial direction, the cavity defines the thermoelectric raw material into a generally prismatic shape, the width corresponds to a maximum diameter of an inscribed circle of the generally prismatic shape of the thermoelectric raw material, and the height corresponds to a height of the generally prismatic shape of the thermoelectric raw material.

32. The method according to claim 25, wherein the primary cooling is unidirectional, and the height dimension is at most 10 millimeters.

33. The method according to claim 25, wherein the primary cooling is bidirectional in directions that are opposite to each other, and the height dimension is at most 20 millimeters.

34. The method according to claim 25, wherein filling the thermoelectric raw material comprises filling a molten state of the thermoelectric raw material.

35. The method according to claim 25, further comprising:
setting a second mold in the cavity of the first mold so as to thermally engage the second mold with the first mold, the second mold having a plurality of holes, and
wherein filling the thermoelectric raw material comprises filling the thermoelectric raw material into the plurality of holes of the second mold;
the solid state of thermoelectric material comprises chips of thermoelectric material in the plurality of holes of the second mold;
preparing the thermoelectric device comprises: forming at least one conductive layer on exposed surfaces of the chips of thermoelectric material in the plurality of holes so as to form a plurality of thermoelectric devices in the plurality of holes, and mounting the plurality of thermoelectric devices comprises extruding the plurality of thermoelectric devices from the plurality of holes.

36. The method according to claim 35, further comprising:

polishing, after cooling the thermoelectric material in the plurality of holes, protruding portions of the thermoelectric material in the plurality of holes, the protruding portion protruding from the plurality of holes.

37. The method according to claim 35, wherein the second mold is higher in thermal conductivity than the thermoelectric material.

38. A method of preparing a thermoelectric material, the method comprising:

preparing a first mold which has a cavity having width and height dimensions, the width dimension being defined in a first direction, the height dimension being defined in axial direction, the axial direction being generally perpendicular to the first direction, the width dimension being equal to or greater than the height dimension;

setting a second mold in the cavity of the first mold so as to thermally engage the second mold with the first mold, the second mold having a plurality of holes which have an axis parallel to the axial direction, the second mold having an electrical conductivity;

filling a thermoelectric raw material into the plurality of holes of the second mold;

cooling the thermoelectric raw material filled in the plurality of holes in the axial direction so as to at a cooling rate of at least 600° C./min. form chips of solidified thermoelectric material in the plurality of holes of the second mold.

39. The method according to claim 38, further comprising:

forming a plated layer on an exposed surface of at least one of the chips of solidified thermoelectric material in the plurality of holes of the second mold; and releasing the chips of solidified thermoelectric material from the plurality of holes of the second mold after forming the plated layer.

* * * * *